United States Patent
Inuzuka

(10) Patent No.: US 11,955,179 B2
(45) Date of Patent: Apr. 9, 2024

(54) SEMICONDUCTOR MEMORY DEVICE

(71) Applicant: Kioxia Corporation, Tokyo (JP)

(72) Inventor: Yuki Inuzuka, Yokohama Kanagawa (JP)

(73) Assignee: Kioxia Corporation, Tokyo (JP)

(*) Notice: Subject to any disclaimer, the term of this patent is extended or adjusted under 35 U.S.C. 154(b) by 128 days.

(21) Appl. No.: 17/853,555

(22) Filed: Jun. 29, 2022

(65) Prior Publication Data

US 2023/0223081 A1 Jul. 13, 2023

(30) Foreign Application Priority Data

Jan. 11, 2022 (JP) ................................. 2022-002327

(51) Int. Cl.
*G11C 16/30* (2006.01)
*G11C 16/04* (2006.01)
*G11C 16/08* (2006.01)
*G11C 16/26* (2006.01)
*H01L 23/522* (2006.01)
*H01L 23/528* (2006.01)
*H10B 41/10* (2023.01)
*H10B 41/27* (2023.01)
*H10B 41/35* (2023.01)
*H10B 43/10* (2023.01)
(Continued)

(52) U.S. Cl.
CPC .......... *G11C 16/0483* (2013.01); *G11C 16/08* (2013.01); *G11C 16/26* (2013.01); *H01L 23/5226* (2013.01); *H01L 23/5283* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02)

(58) Field of Classification Search
CPC ......... G11C 16/30; G11C 16/28; G11C 16/04; G11C 16/26
See application file for complete search history.

(56) References Cited

U.S. PATENT DOCUMENTS

2012/0275226 A1* 11/2012 Nakamura ............. G11C 16/30
                                                    365/185.21
2015/0109862 A1   4/2015 Shibata et al.
(Continued)

FOREIGN PATENT DOCUMENTS

JP  2017168163 A  9/2017
JP  2021047964 A  3/2021
(Continued)

*Primary Examiner* — Jason Lappas
(74) *Attorney, Agent, or Firm* — Holtz, Holtz & Volek PC

(57) ABSTRACT

The semiconductor memory device of the embodiment includes: a substrate; a first memory pillar extending in a first direction from the substrate, the first memory pillar including first memory cell transistors, a first selection transistor, a second selection transistor, second memory cell transistors, a third selection transistor, a fourth selection transistor, third memory cell transistors, a fifth selection transistor, a sixth selection transistor, fourth memory cell transistors, a seventh selection transistor, and an eighth selection transistor; a first select gate line; first word lines; a second select gate line; a third select gate line; second word lines; a fourth select gate line; a fifth select gate line; third word lines; a sixth select gate line; a seventh select gate line; fourth word lines; and an eighth select gate line.

6 Claims, 25 Drawing Sheets

(51) Int. Cl.
*H10B 43/27* (2023.01)
*H10B 43/35* (2023.01)

(56) References Cited

U.S. PATENT DOCUMENTS

| | | |
|---|---|---|
| 2016/0322369 A1 | 11/2016 | Shibata et al. |
| 2017/0271021 A1 | 9/2017 | Futatsuyama et al. |
| 2021/0090665 A1 | 3/2021 | Funatsuki et al. |
| 2022/0301636 A1 | 9/2022 | Sano et al. |
| 2023/0005957 A1 | 1/2023 | Nakatsuka |

FOREIGN PATENT DOCUMENTS

| | | |
|---|---|---|
| JP | 2022144318 | 10/2022 |
| WO | 2021191951 A1 | 9/2021 |

* cited by examiner

FIG.18A SG
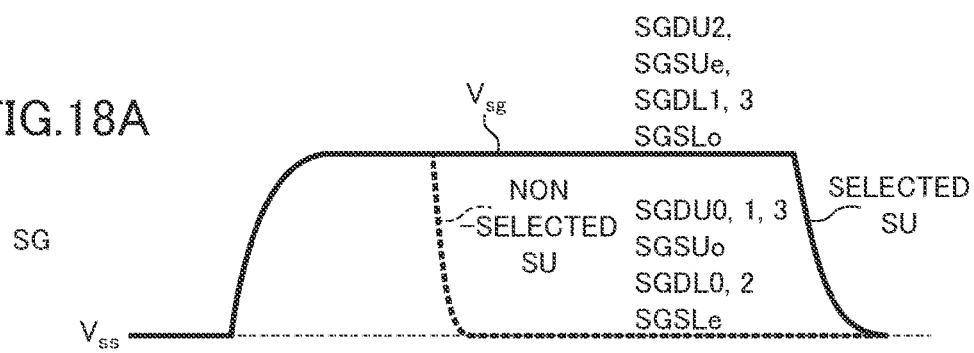
FIG.18B WLSe
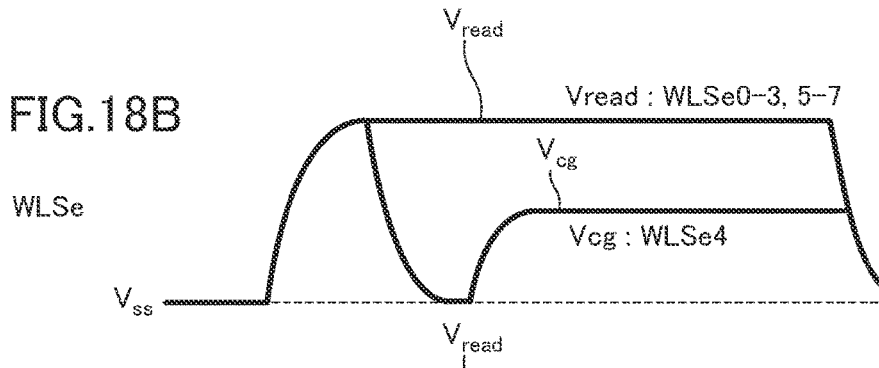
FIG.18C WLSo
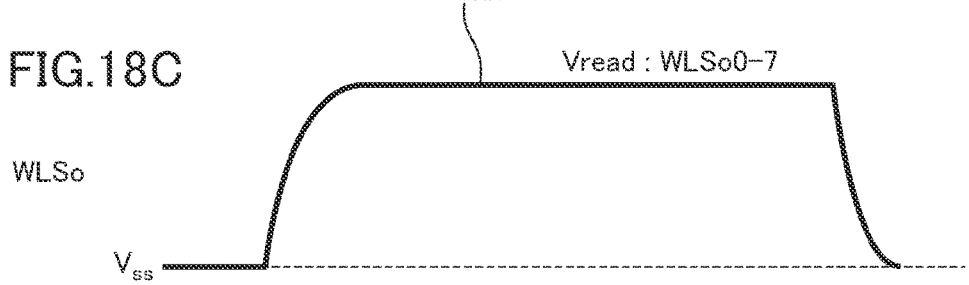
TIME

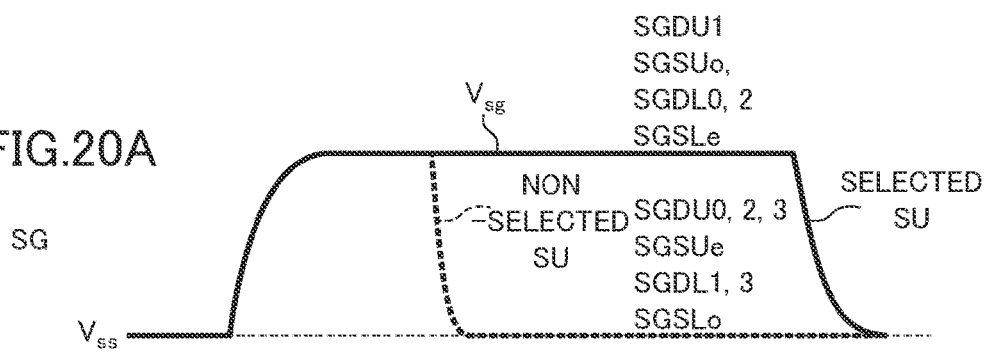
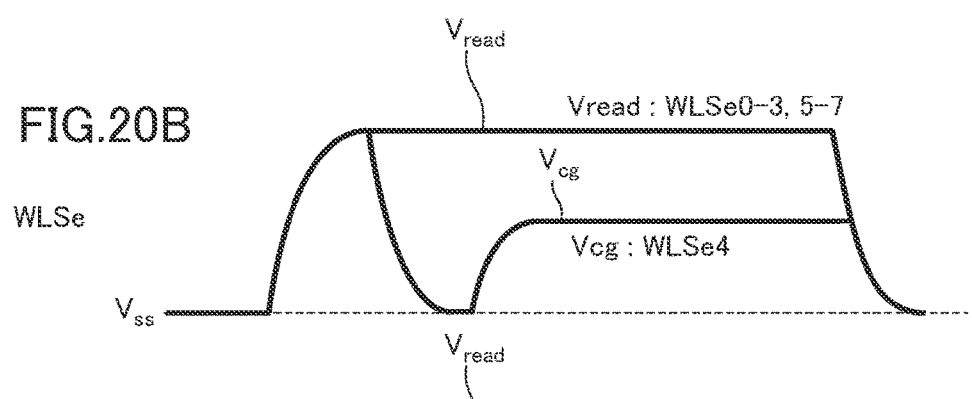
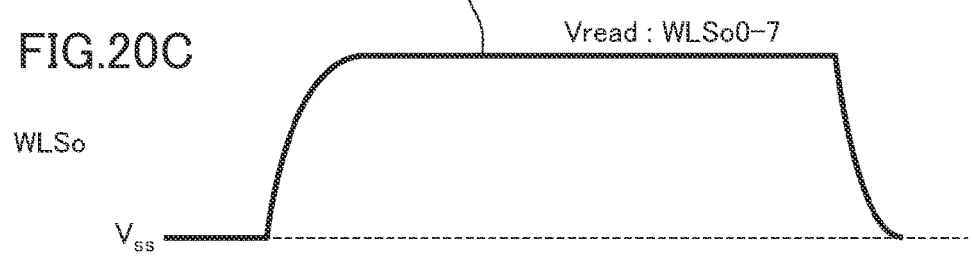

SEMICONDUCTOR MEMORY DEVICE

CROSS-REFERENCE TO RELATED APPLICATION

This application is based upon and claims the benefit of priority from Japanese Patent Application No. 2022-002327, filed on Jan. 11, 2022, the entire contents of which are incorporated herein by reference.

FIELD

Embodiments described herein relate generally to semiconductor memory device.

BACKGROUND

A NAND flash memory is known as a non-volatile semiconductor memory device.

BRIEF DESCRIPTION OF THE DRAWINGS

FIGS. 18A-C are diagrams schematically illustrating a timing chart of various signals at the time of the data reading operation in the semiconductor memory device of the first embodiment.

FIGS. 20A-C are diagrams schematically illustrating a timing chart of various signals at the time of the data reading operation in the semiconductor memory device of the first embodiment.

DETAILED DESCRIPTION

Figure 1:
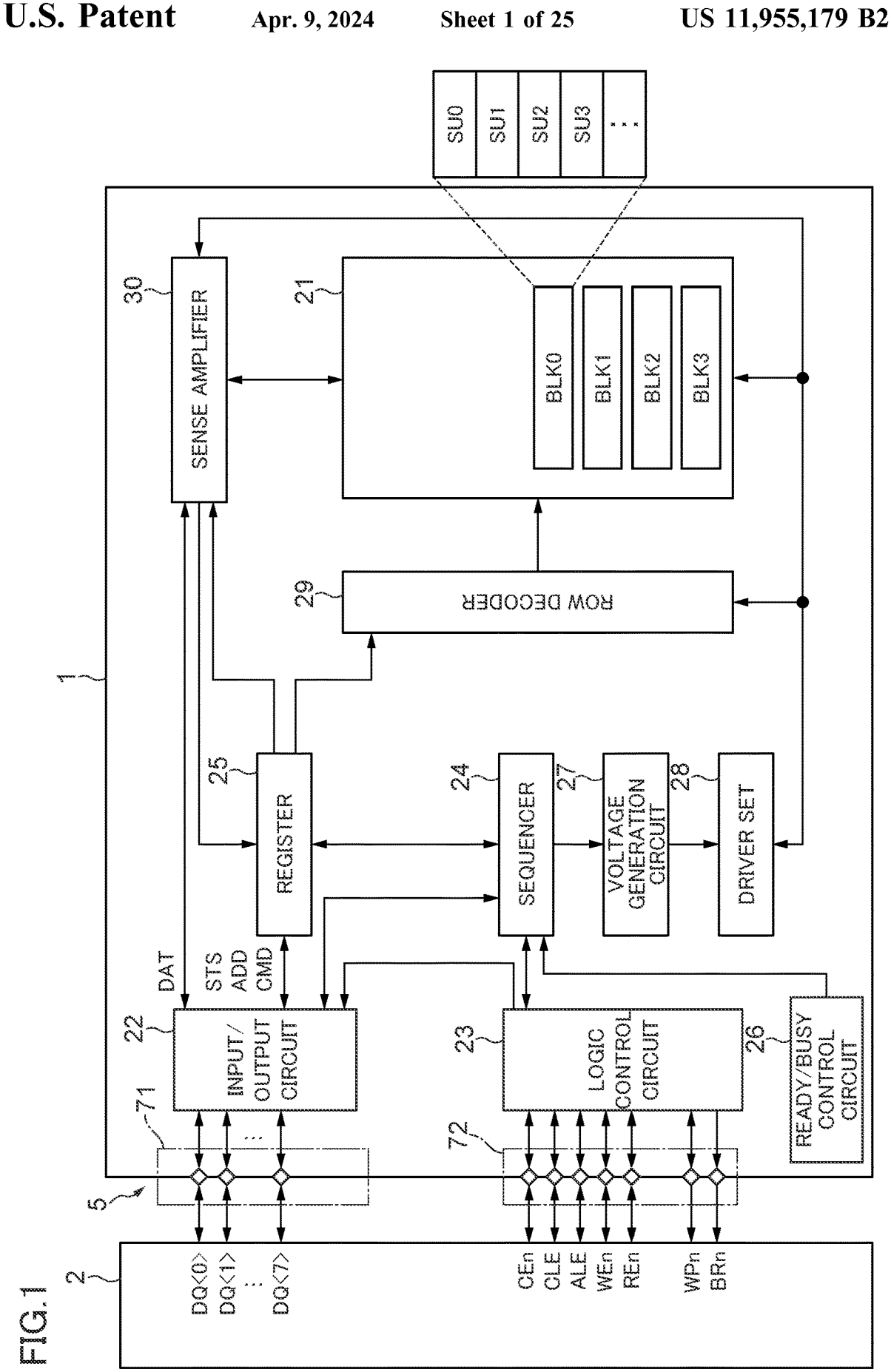
FIG. 1 is a block diagram showing the configuration of a memory system including a semiconductor memory device according to a first embodiment.

The semiconductor storage device of the embodiment includes a semiconductor memory device, including: a substrate; a first memory pillar extending in a first direction from the substrate, the first memory pillar including a plurality of first memory cell transistors electrically connected in series with each other, and the first memory cell transistors having a first end and a second end, a first selection transistor electrically connected to the first end, a second selection transistor electrically connected to the second end, a plurality of second memory cell transistors electrically connected in series with each other, the second memory cell transistors having a third end and a fourth end, and the second memory cell transistors being electrically insulated from the first memory cell transistors, a third selection transistor electrically connecting the first selection transistor and the third end, a fourth selection transistor electrically connecting the second selection transistor and the fourth end, a plurality of third memory cell transistors electrically connected in series with each other, and the third memory cell transistors having a fifth end and a sixth end, a fifth selection transistor electrically connecting the second selection transistor, the fourth selection transistor and the fifth end, a sixth selection transistor electrically connected to the sixth end, a plurality of fourth memory cell transistors electrically connected in series with each other, the fourth memory cell transistors having a seventh end and an eighth end, and the fourth memory cell transistors being electrically insulated from the third memory cell transistors, a seventh selection transistor electrically connecting the second selection transistor, the fourth selection transistor, the fifth selection transistor and the seventh end, and an eighth selection transistor electrically connecting the sixth selection transistor and the eighth end; a first select gate line provided above the substrate and in parallel to the substrate surface of the substrate, the first select gate line facing a first side of the first memory pillar, and the first select gate line being electrically connected to a gate of the first selection transistor; a plurality of first word lines provided above the first select gate line and in parallel to the substrate surface of the substrate, the first word lines facing the first side of the first memory pillar, and the first word lines being electrically connected to gates of the first memory cell transistors, respectively; a second select gate line provided above the first word lines and in parallel to the substrate surface of the substrate, the second select gate line facing the first side of the first memory pillar, and the second select gate line being electrically connected to a gate of the second selection transistor; a third select gate line provided above the substrate and in parallel to the substrate surface of the substrate, a position of the third select gate line in the first direction being the same as a position of the first select gate line in the first direction, the third select gate line facing a second side of the first memory pillar, and the third select gate line being electrically connected to a gate of the third selection transistor; a plurality of the second word lines provided above the third select gate line and in parallel to the substrate surface of the substrate, a position of the second word lines in the first direction being the same as a position of the first word lines in the first direction, respectively, the second word lines facing the second side of the first memory pillar, and the second word lines being electrically connected to gates of the second memory cell transistors, respectively; a fourth select gate line provided above the second word lines and in parallel to the substrate surface of the substrate, a position of the fourth select gate line in the first direction being the same as a position of the second select gate line in the first direction, the fourth select gate line facing the second side of the first memory pillar, and the fourth select gate line being electrically connected to a gate of the fourth selection transistor; a fifth select gate line provided above the substrate and in parallel to the substrate surface of the substrate, the fifth select gate line facing the first side of the first memory pillar, and the fifth select gate line being electrically connected to a gate of the fifth selection transistor; a plurality of third word lines provided above the fifth select gate line and in parallel to the substrate surface of the substrate, the third word lines facing the first side of the first memory pillar, and the third word lines being electrically connected to a gate of the third memory cell transistor and the first word lines, respectively; a sixth select gate line provided above the third word lines and in parallel to the substrate surface of the substrate, the sixth select gate line facing the first side of the first memory pillar, and the sixth select gate line being electrically connected to the sixth selection transistor; a seventh select gate line provided above the substrate and in parallel to the substrate surface of the substrate, a position of the seventh select gate line in the first direction being the same as a position of the fifth select gate line, the seventh select gate line facing the second side of the first memory pillar, and the seventh select gate line being electrically connected to a gate of the seventh selection transistor; a plurality of fourth word lines provided above the seventh select gate line and in parallel to the substrate surface of the substrate, a position of the fourth word lines in the first direction being the same as a position of the third word lines, respectively, the fourth word lines facing the second side of the first memory pillar, and the fourth word lines being electrically connected to the second word lines and the gates of the fourth memory cell transistors, respectively; and an eighth select gate line provided above the fourth word lines and in parallel to the substrate surface of the substrate, a position of the eighth select gate line in the first direction being the same as a position of the sixth select gate line, the eighth select gate line facing the second side of the first memory pillar, and the eighth select gate line being electrically connected to a gate of the eighth selection transistor.

Hereinafter, embodiments will be described with reference to the diagrams. In addition, in the diagrams, the same or similar elements are denoted by the same or similar reference numerals.

First Embodiment

FIG. 1 is a block diagram showing an example of the configuration of a memory system 3 including a semiconductor memory device 1 according to a first embodiment. The configuration of the memory system 3 including the semiconductor memory device 1 according to the first embodiment is not limited to the configuration shown in FIG. 1.

As shown in FIG. 1, the memory system 3 includes the semiconductor memory device 1 and a memory controller 2. The memory system 3 is, for example, a memory card such as an SSD (solid state drive) or an SD™ card. The memory system 3 may include a host device (not shown).

The semiconductor memory device 1 is connected to, for example, the memory controller 2, and is controlled by using the memory controller 2. The memory controller 2 receives, for example, an instruction necessary for the operation of the semiconductor memory device 1 from the host device, and transmits the instruction to the semiconductor memory device 1. The memory controller 2 transmits the instruction to the semiconductor memory device 1 to control the reading of data from the semiconductor memory device 1, writing of data into the semiconductor memory device 1, or erasing data in the semiconductor memory device 1. In embodiments, the semiconductor memory device 1 is, for example, a NAND flash memory.

As shown in FIG. 1, the semiconductor memory device 1 includes a memory cell array 21, an input/output circuit 22, a logic control circuit 23, a sequencer 24, a register 25, a ready/busy control circuit 26, a voltage generation circuit 27, a driver set 28, a row decoder 29, a sense amplifier 30, an input/output pad group 71, and a logic control pad group 72. In the semiconductor memory device 1, various operations, such as a write operation for storing write data DAT in the memory cell array 21 and a read operation for reading read data DAT from the memory cell array 21, are executed. The configuration of the semiconductor memory device 1 according to embodiments is not limited to the configuration shown in FIG. 1.

The memory cell array 21 is connected to, for example, the sense amplifier 30, the row decoder 29, and the driver set 28. The memory cell array 21 includes blocks BLK0, BLK1, . . . , BLKn (n is an integer of 1 or more). Although details will be described later, each block BLK includes a plurality of string units SU (SU0, SU1, SU2, . . . ). Each of the string units SU includes a plurality of non-volatile memory cells associated with bit lines and word lines. The block BLK is, for example, a data erasing unit. Data held by memory cell transistors MT (FIG. 2) included in the same block BLK is collectively erased.

In the semiconductor memory device 1, for example, a TLC (triple-level cell) method or a QLC (quadruple level cell) method can be applied. In the TLC method, 3-bit data is held in each memory cell, and in the QLC method, 4-bit data is held in each memory cell. In addition, data of 2 bits or less may be held in each memory cell, or data of 5 bits or more may be held in each memory cell.

The input/output circuit 22 is connected to, for example, the register 25, the logic control circuit 23, and the sense amplifier 30. The input/output circuit 22 controls the transmission and reception of a data signal DQ<7:0> between the memory controller 2 and the semiconductor memory device 1.

The data signal DQ<7:0> is an 8-bit signal. The data signal DQ<7:0> is an entity of data transmitted and received between the semiconductor memory device 1 and the memory controller 2, and includes a command CMD, data DAT, address information ADD, status information STS, and the like. The command CMD includes, for example, an instruction for executing an instruction transmitted from the host device (memory controller 2) to the semiconductor memory device 1. The data DAT includes the data DAT written into the semiconductor memory device 1 or the data DAT read from the semiconductor memory device 1. The address information ADD includes, for example, a column address and a row address for selecting a plurality of non-volatile memory cells associated with bit lines and word lines. The status information STS includes, for example, information regarding the status of the semiconductor memory device 1 regarding the write operation and the read operation.

More specifically, the input/output circuit 22 includes an input circuit and an output circuit, and the input circuit and the output circuit perform processing described below. The input circuit receives the write data DAT, the address information ADD, and the command CMD from the memory controller 2. The input circuit transmits the received write data DAT to sense amplifier 70, and the input circuit transmits the received address information ADD and commands CMD to register 25. On the other hand, the output circuit receives the status information STS from the register 25, and receives the read data DAT from the sense amplifier 30. The output circuit transmits the received status information STS and read data DAT to the memory controller 2.

The logic control circuit 23 is connected to, for example, the memory controller 2 and the sequencer 24. The logic control circuit 23 receives, for example, a chip enable signal CEn, a command latch enable signal CLE, an address latch enable signal ALE, a write enable signal WEn, a read enable signal REn, and a write protect signal WPn from the memory controller 2. The logic control circuit 23 controls the input/output circuit 22 and the sequencer 24 based on the received signals.

The chip enable signal CEn is a signal for enabling the semiconductor memory device 1. The command latch enable signal CLE is a signal for notifying the input/output circuit 22 that the signal DQ input to the semiconductor memory device 1 is the command CMD. The address latch enable signal ALE is a signal for notifying the input/output circuit 22 that the signal DQ input to the semiconductor memory device 1 is the address information ADD. The write enable signal WEn and the read enable signal REn are, for example, signals for instructing the input/output circuit 22 to input and output the data signal DQ, respectively. The write protect signal WPn is a signal for instructing the semiconductor memory device 1 to prohibit writing and erasing of data.

The sequencer 24 is connected to, for example, the ready/busy control circuit 26, the sense amplifier 30, and the driver set 28. The sequencer 24 controls the overall operation of the semiconductor memory device 1 based on the command CMD held in the command register. For example, the sequencer 24 controls the sense amplifier 30, the row decoder 29, the voltage generation circuit 27, the driver set 28, and the like to execute various operations, such as a write operation and a read operation.

The register 25 includes, for example, a status register (not shown), an address register (not shown), a command register (not shown), and the like. The status register receives the status information STS from the sequencer 24, holds the status information STS, and transmits the status information STS to the input/output circuit 22 based on the instruction of the sequencer 24. The address register receives the address information ADD from the input/output circuit 22 and holds the address information ADD. The address register transmits a column address in the address information ADD to the sense amplifier 70, and transmits a row address in the address information ADD to the row decoder 29. The command register receives the command CMD from the input/output circuit 22, holds the command CMD, and transmits the command CMD to the sequencer 24.

The ready/busy control circuit 26 generates a ready/busy signal R/Bn according to the control of the sequencer 24, and transmits the generated ready/busy signal R/Bn to the memory controller 2. The ready/busy signal R/Bn is a signal for notifying whether the semiconductor memory device 1 is in a ready state in which an instruction from the memory controller 2 is accepted or in a busy state in which no instruction is accepted.

The voltage generation circuit 27 is connected to, for example, the driver set 28 or the like. The voltage generation circuit 27 generates a voltage used for a write operation, a read operation, and the like based on the control of the sequencer 24, and supplies the generated voltage to the driver set 28.

Figure 12:
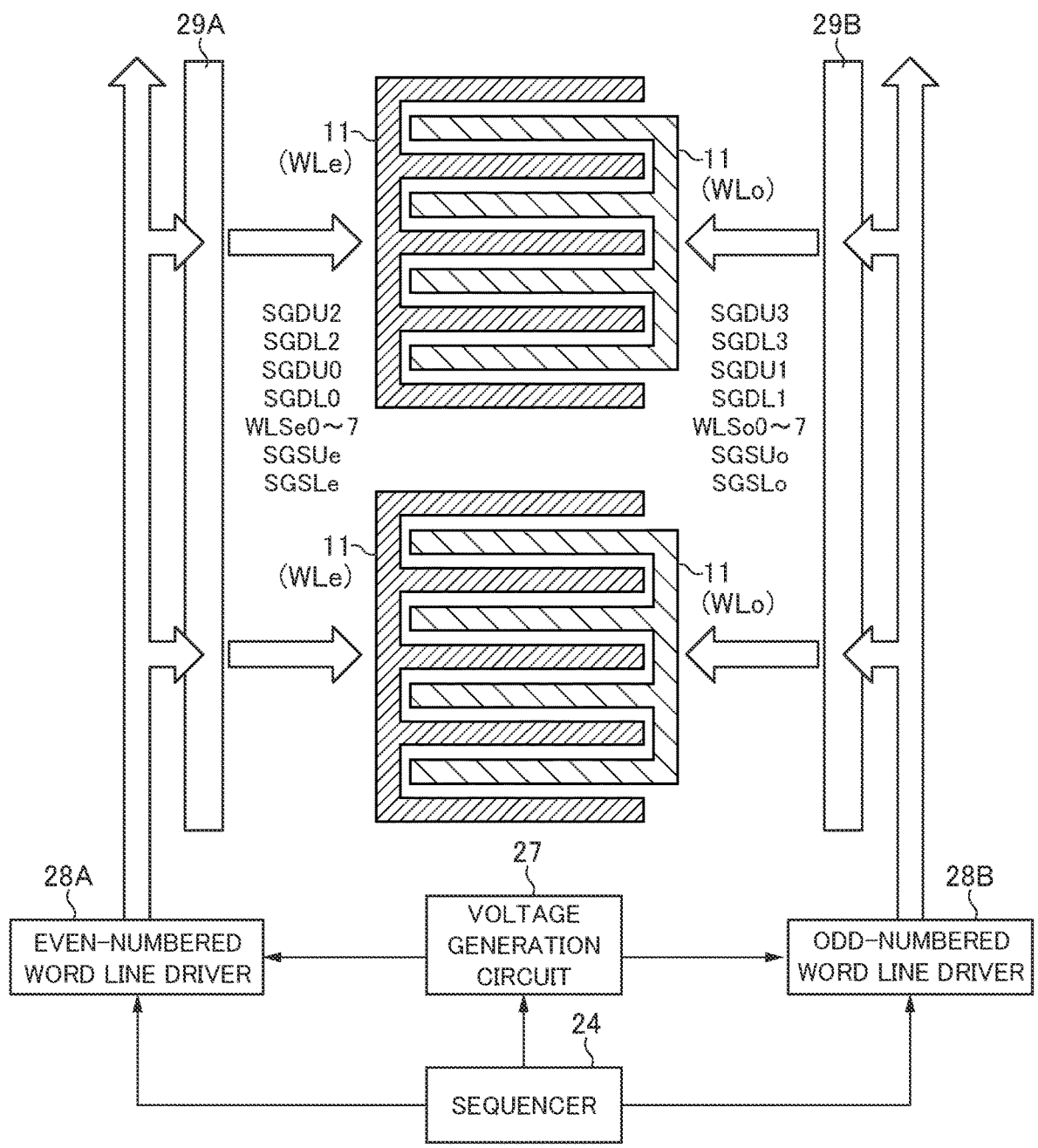
FIG. 12 is a diagram for explaining the electrical connection of a voltage generation circuit, a driver set, a select gate line, or a word line according to the first embodiment.

The driver set 28 includes, for example, an even side driver 28A (FIG. 12) and an odd side driver 28B (FIG. 12). The driver set 28 is connected to the memory cell array 21, the sense amplifier 70, and the row decoder 29. Based on the voltage supplied from the voltage generation circuit 27, the driver set 28 generates various voltages to be applied to a select gate line SGD (FIG. 2), a word line WL (FIG. 2), a source line SL (FIG. 2), and the like in various operations such as a read operation and a write operation, for example. The driver set 28 supplies the generated voltage to the even side driver 28A, the odd side driver 28B, the sense amplifier 30, the row decoder 29, the source line SL, and the like.

The row decoder 29 receives a row address from the address register and decodes the received row address. The row decoder 29 selects a block BLK, in which various operations such as a read operation and a write operation are to be executed, based on the decoding result. The row decoder 29 can supply the voltage supplied from the driver set 28 to the selected block BLK.

The sense amplifier 30 receives a column address from the address register and decodes the received column address, for example. In addition, the sense amplifier 30 executes an operation of transmitting and receiving the data DAT between the memory controller 2 and the memory cell array 21 based on the decoding result. The sense amplifier 30 includes, for example, a sense amplifier unit (not shown) provided for each bit line. The sense amplifier 30 makes it possible to supply a voltage to the bit line BL by using the sense amplifier unit. For example, the sense amplifier 30 can supply a voltage to a bit line by using a sense amplifier unit. In addition, the sense amplifier 30 senses the data read from the memory cell array 21, generates the read data DAT, and transmits the generated read data DAT to the memory controller 2 through the input/output circuit 22. In addition, the sense amplifier 30 receives the write data DAT from the memory controller 2 through the input/output circuit 22, and transmits the received write data DAT to the memory cell array 21.

The input/output pad group 71 transmits the data signal DQ<7:0> received from the memory controller 2 to the input/output circuit 22. The input/output pad group 71 transmits the data signal DQ<7:0> received from the input/output circuit 22 to the memory controller 2.

The logic control pad group 72 transmits the chip enable signal CEn, the command latch enable signal CLE, the address latch enable signal ALE, the write enable signal WEn, and the read enable signal REn received from the memory controller 2 to the logic control circuit 23. The logic control pad group 72 transmits the ready/busy signal R/Bn received from the ready/busy control circuit 26 to the memory controller 2.

Figure 2:
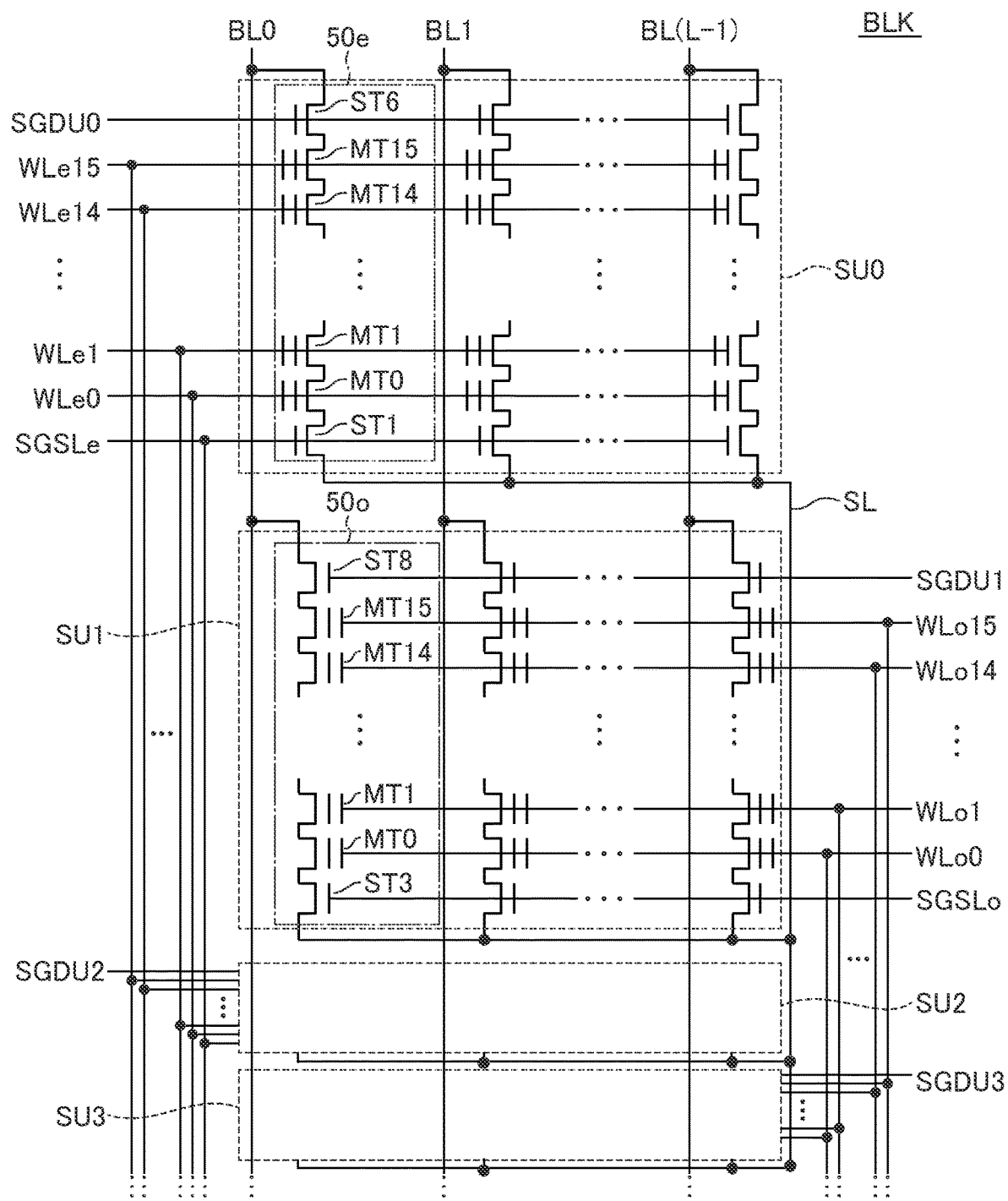
FIG. 2 is a schematic diagram showing the circuit configuration of a memory cell array in the semiconductor memory device according to the first embodiment.

FIG. 2 is an example of the circuit configuration of the memory cell array 21 shown in FIG. 1. FIG. 2 is a diagram showing the circuit configuration of one block BLK among a plurality of blocks BLK included in the memory cell array 21. For example, each of the plurality of blocks BLK included in the memory cell array 21 has the circuit configuration shown in FIG. 2. The configuration of the memory cell array 21 according to embodiments is not limited to the configuration shown in FIG. 2. In the description of FIG. 2, the description of the same or similar configuration as that of FIG. 1 may be omitted.

As shown in FIG. 2, the block BLK includes a plurality of string units SU (SU0, SU1, SU2, and SU3). In embodiments, the write operation and the read operation are executed in units of the string unit SU (page). Each of the string units SU includes a plurality of NAND strings 50. For example, the string units SU0 and SU2 include a plurality of NAND strings 50e, and the string units SU1 and SU3 include a plurality of NAND strings 50o. In addition, although FIG. 2 shows an example in which each block BLK includes four string units SU0, SU1, SU2, and SU3, the number of string units included in each block is not limited to four. For example, each block BLK may include six or eight string units.

Each NAND string 50 includes, for example, 16 memory cell transistors MTs (MT0 to MT15) and 4 selection transistors (ST1, ST2, ST5 and ST6 or ST3, ST4, ST7 and ST8). Each memory cell transistor MT includes a control gate and a charge storage layer, and holds data in a non-volatile manner. Sixteen memory cell transistors MTs and four selection transistors are connected in series.

Figure 9:
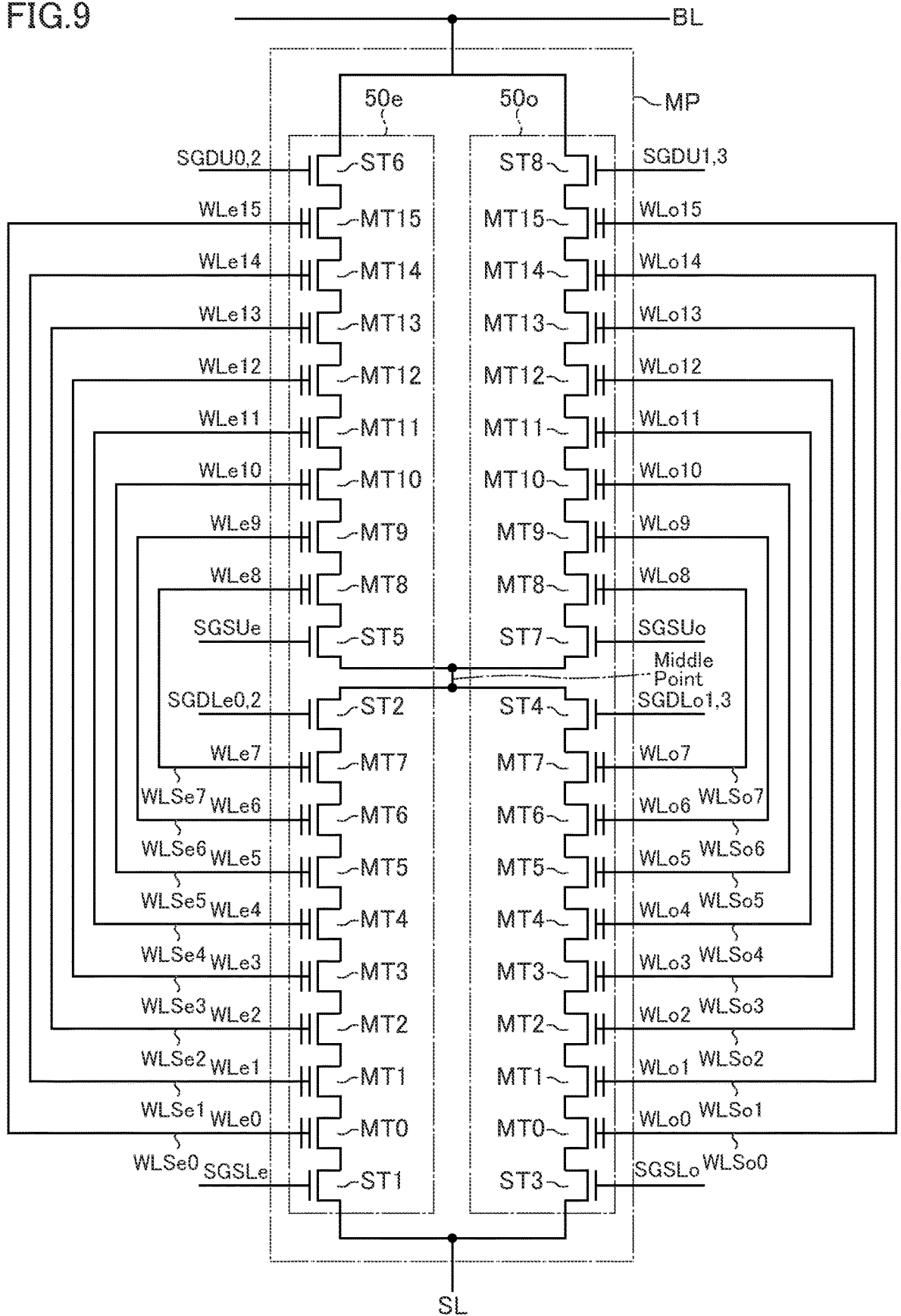
FIG. 9 is a diagram showing an equivalent circuit of a memory pillar in the semiconductor memory device according to the first embodiment.
Figure 10:
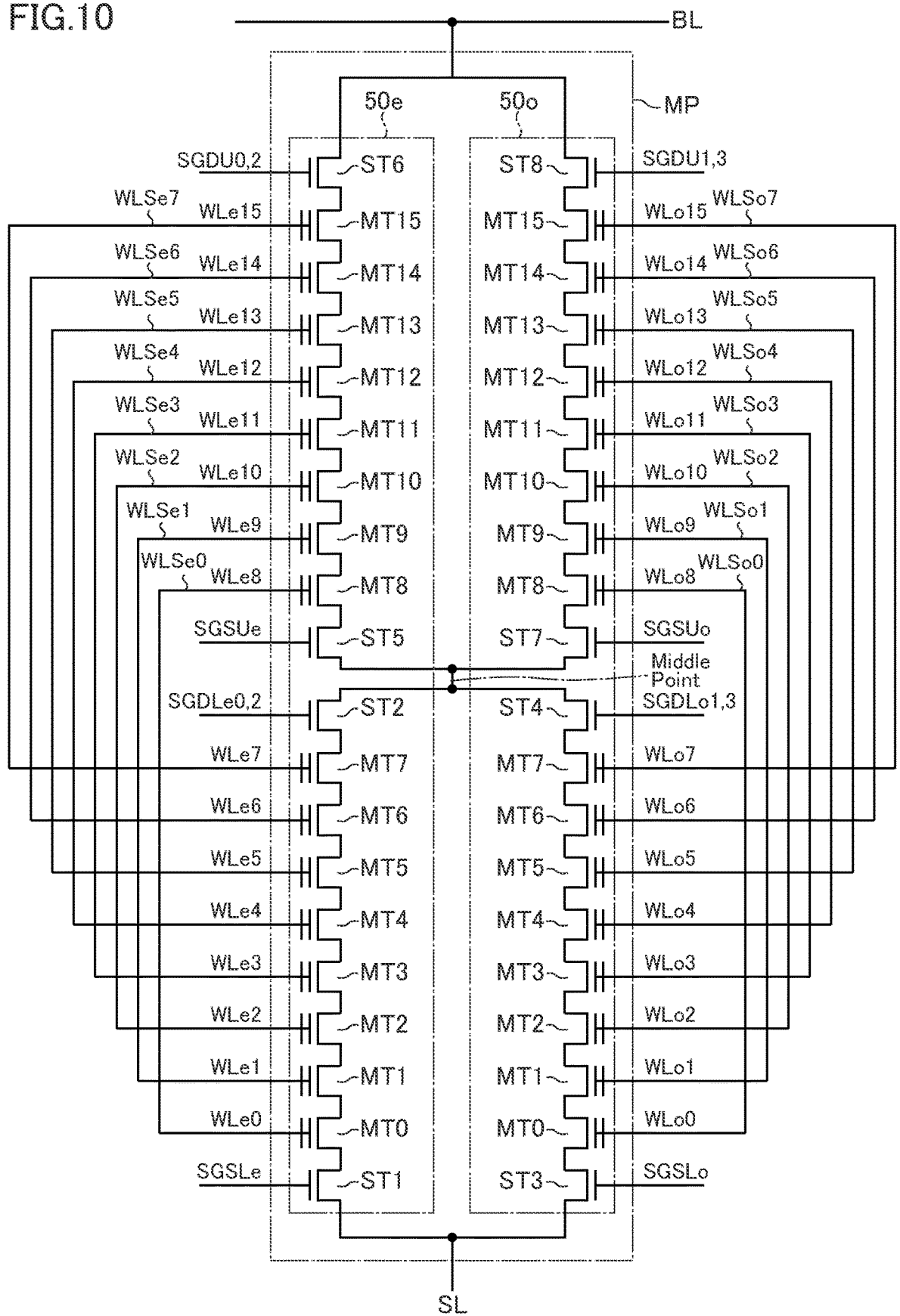
FIG. 10 is a diagram showing an another exemplary equivalent circuit of a memory pillar in the semiconductor memory device according to the first embodiment.

More specifically, for example, as shown in FIGS. 9 and 10, in NAND string 50e, memory cell transistors MT0 to MT15 are connected in series between the drain of selection transistor ST1 and the source of selection transistor ST6, and in NAND string 50o, memory cell transistors MT0 to MT15 are connected in series between drain of selection transistor ST3 and the source of selection transistor ST8. More specifically, in NAND string 50e, eight memory cell transistors MT0 to MT7 are connected in series between the drain of selection transistor ST1 and the source of selection transistor ST2, and the remaining eight memory cell transistors MT8 to MT15 are connected in series between the drain of selection transistor ST5 and the source of selection transistor ST6. Further, the source of selection transistor ST2 and the drain of selection transistor ST5 are connected at the midpoint MP. Similarly, in NAND string 50o, eight memory cell transistors MT0 to MT7 are connected in series between the drain of selection transistor ST3 and the source of selection transistor ST4, and the remaining eight memory cell transistors MT8 to MT15 are connected in series between the drain of selection transistor ST7 and the source of selection transistor ST8. The source of selection transistor ST3 and the drain of selection transistor ST7 are connected at the midpoint MP.

In other words, NAND string 50e is connected to the source line SL via the selection transistor ST1, is connected to the bit line BL via the selection transistor ST6, and is connected to the midpoint MP via the selection transistor ST2 and the selection transistor ST5. Similarly, NAND string 50o is connected to the source line SL via the selection transistor ST3, is connected to the bit line BL via the selection transistor ST8, and is connected to the midpoint MP via the selection transistor ST4 and the selection transistor ST7.

The gates of the selection transistor ST6 in each of string unit SUs are connected to select gate line SGD (SGDU0, SGDU2, . . . ), respectively. The gates of the selection transistor ST8 in each of string unit SUs are connected to select gate line SGD (SGDU1, SGDU3, . . . ) respectively. The gates of the selection transistor ST5 in each of string unit SUs are connected to select gate line SGS (SGSUe), respectively. The gates of the selection transistor ST7 in each of string unit SUs are connected to select gate line SGS (SGSUo), respectively. The gates of the selection transistor ST2 in each of string unit SUs are connected to select gate line SGDs (SGDLe0, SGDLe2, . . . ), respectively. The gates of the selection transistor ST4 in each of string unit SUs are connected to select gate line SGDs (SGDLo1, SGDLo3, . . . ), respectively. The gates of the selection transistor ST1 in each of string unit SUs are connected to select gate line SGS (SGSLe), respectively. The gates of selection transistor ST3 in each of string unit SUs are connected to select gate line SGS (SGSLo), respectively. The select gate line SGD is independently controlled by the row decoder 29. The even select gate line SGSUe, SGSLe and odd select gate line SGSUo, SGSLo may, for example, be connected to each other and controlled in the same manner, and may be provided independently of each other and controllable independently.

The control gates of memory cell transistor MTs (MT0 to MT15) included in string unit SUes in the same block BLK are commonly connected to the word line WLe (WLe0 to WLe15). The control gates of memory cell transistor MTs (MT0 to MT15) included in string unit SUo in the same block BLK are commonly connected to the word line WLo (WLo0 to WLo15). Select gate line WLe and select gate line WLo are independently controlled by row decoder 29.

The drains of the selection transistors ST6 or ST8 of the NAND strings 50 in the same row in the memory cell array 21 are commonly connected to the bit line BL (BL0 to BL(L−1), where (L−1) is a natural number of 2 or more). That is, in the bit line BL, the NAND string 50 is commonly connected between the plurality of string units SU. A plurality of selection transistor ST1 or ST2 sources are commonly connected to source line SLs. For example, the source line SL is electrically connected to the driver set 28, and a voltage is supplied from the voltage generation circuit 27 or the driver set 28 under the control of the voltage generation circuit 27 and the driver set 28 using the sequencer 24. In addition, the semiconductor memory device 1 according to embodiments may include a plurality of source lines SL. For example, each of the plurality of source lines SL may be electrically connected to the driver set 28, so that different voltages are supplied from the voltage generation circuit 27 or the driver set 28 to each of the plurality of source lines SL under the control of the voltage generation circuit 27 and the driver set 28 using the sequencer 24.

The string unit SU includes a plurality of NAND strings 50 connected to different bit lines BL and connected to the same select gate line SGD. The block BLK includes a plurality of string units SU having the common word line WL. The memory cell array 21 includes a plurality of blocks BLK having the common bit line BL. In the memory cell array 21, the above-described select gate line SGS, word line WL, and select gate line SGD are stacked above the source line layer, and the memory cell transistor MT is stacked in a three-dimensional manner.

Figure 3:
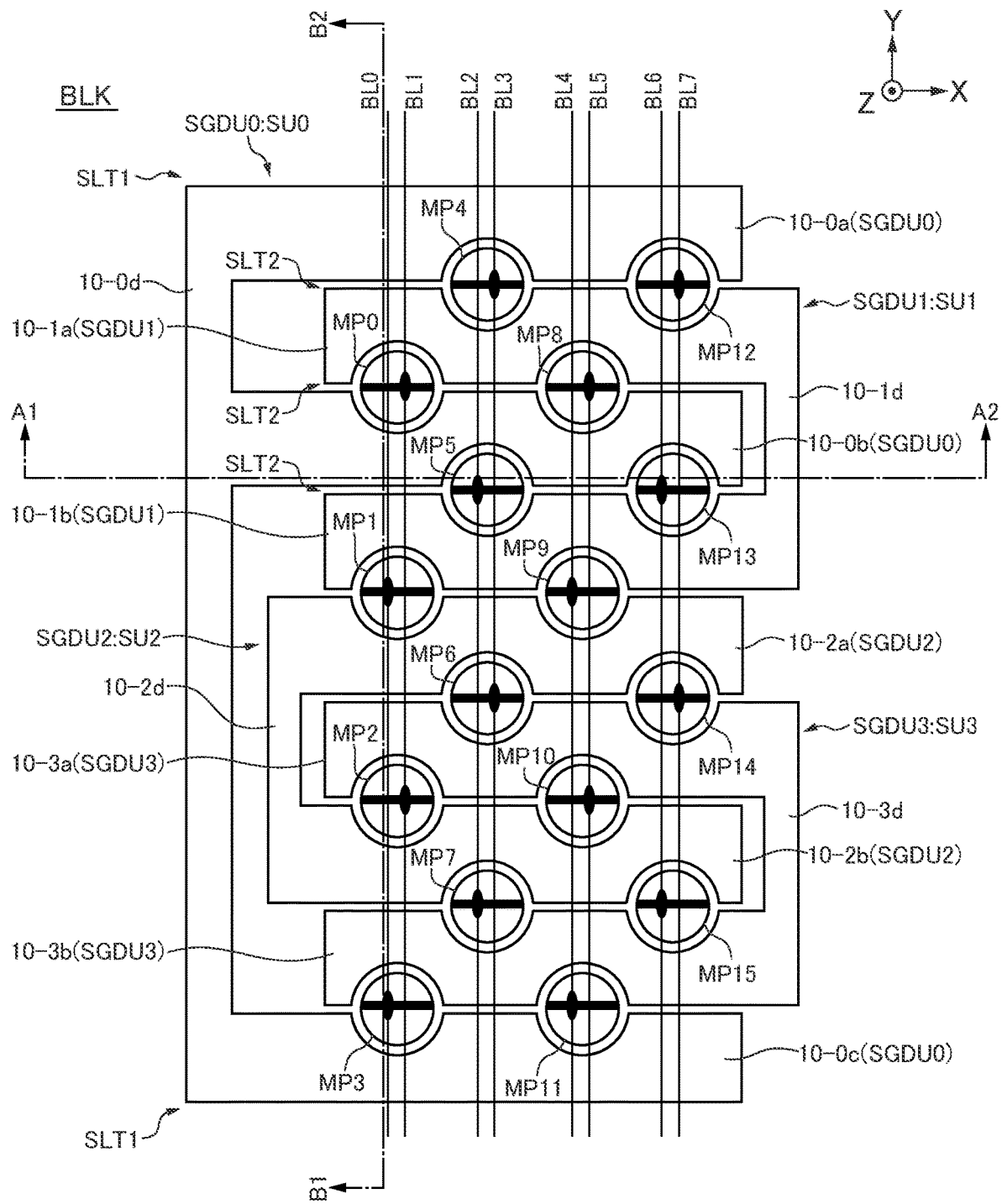
FIG. 3 is a schematic diagram showing the planar layout of select gate lines, bit lines, and memory pillars according to the first embodiment.

FIG. 3 is a diagram showing the planar layout of the select gate lines SGDU on a plane (XY plane) parallel to the source line layer of a predetermined block BLK. As shown in FIG. 3, in the semiconductor memory device 1 according to embodiments, for example, four select gate lines SGDU are included in one block BLK. The planar layout of the select gate lines SGDU according to embodiments is not limited to the layout shown in FIG. 3. In the description of FIG. 3, the description of the same or similar configuration as that of FIGS. 1 and 2 may be omitted.

As shown in FIG. 3, in the semiconductor memory device 1 according to embodiments, for example, three wiring layers 10-0a, 10-0b, and 10-0c extending in the X direction are connected to each other using a first connection portion 10-0d extending in the Y direction. The wiring layers 10-0a and 10-0c are located at both ends in the Y direction. The wiring layer 10-0a and the wiring layer 10-0b are adjacent to each other in the Y direction with another wiring layer (wiring layer 10-1a) interposed between the wiring layer 10-0a and the wiring layer 10-0b. The first connection portion 10-0d is located at one end in the X direction. The three wiring layers 10-0a, 10-0b, and 10-0c function as the select gate line SGDU0. In embodiments, for example, the Y direction is a direction perpendicular or approximately perpendicular to the X direction.

The wiring layers 10-1a and 10-1b extending in the X direction are connected to each other using a second connection portion 10-1d extending in the Y direction. The wiring layer 10-1a is located between the wiring layers 10-0a and 10-0b. The wiring layer 10-1b is located between the wiring layer 10-0b and another wiring layer (wiring layer 10-2a). The second connection portion 10-1d is located at the other end of the first connection portion 10-0d on the opposite side in the X direction. The 2 wiring layers 10-1a and 10-1b function as the select gate line SGDU1.

The wiring layers 10-2a and 10-2b extending in the X direction are connected to each other by a first connection portion 10-2d extending in the Y direction. Similarly, wiring layers 10-3a and 10-3b extending in the X direction are connected to each other by a second connection portion 10-3d extending in the Y direction. The wiring layer 10-2a is located between the wiring layer 10-1b and the wiring layer 10-3a. The wiring layer 10-3a is located between the wiring layer 10-2a and the wiring layer 10-2b. The wiring layer 10-2b is located between the wiring layer 10-3a and the wiring layer 10-3b. The wiring layer 10-3b is located between the wiring layer 10-2b and the wiring layer 10-0c. The first connecting portion 10-2d is located at one end on the same side as the first connecting portion 10-0d in the X direction. The second connecting portion 10-3d is located at the other end of the first connecting portion 10-0d on the opposite side in the X direction. The 2 wiring layers 10-2a and 10-2b function as the select gate line SGDU2. The 2 wiring layers 10-3a and 10-3b function as the select gate line SGDU3.

In embodiments, a configuration is exemplified in which the respective wiring layers are connected to each other by using the first connection portions 10-0d and 10-2d or the second connection portions 10-1d and 10-3d. However, embodiments are not limited to this configuration. For example, each wiring layer is independent, and is controlled such that the same voltage is supplied to the wiring layers 10-0a, 10-0b, and 10-0c, the same voltage is supplied to the wiring layers 10-1a and 10-1b, the same voltage is supplied to the wiring layers 10-2a and 10-2b, and the same voltage is supplied to the wiring layers 10-3a and 10-3b.

The string unit SU including the NAND string 50e of a memory pillar MP adjacent to the wiring layers 10-0a, 10-0b, and 10-0c is called SU0. The string unit SU including the NAND string 50o of the memory pillar MP adjacent to the wiring layers 10-1a and 10-1b is called SU1. The string unit SU including the NAND string 50e of the memory pillar MP adjacent to the wiring layers 10-2a and 10-2b is called SU2. The string unit SU including the NAND string 50o of the memory pillar MP adjacent to the wiring layers 10-3a and 10-3b is called SU3.

The wiring layers 10 adjacent to each other in the Y direction in the block BLK are insulated. The region that insulates the adjacent wiring layers 10 from each other is called a slit SLT2. In the slit SLT2, for example, a region from a surface parallel to the source line layer to at least a layer in which the wiring layer 10 is provided is embedded by using an insulating film (not shown). In addition, in the memory cell array 21, for example, a plurality of blocks BLK shown in FIG. 3 are arranged in the Y direction. Similar to the wiring layers 10 adjacent to each other in the Y direction in the block BLK, a region between the blocks BLK adjacent to each other in the Y direction is embedded by using an insulating film (not shown), thereby insulating the blocks BLK adjacent to each other in the Y direction from each other. The region that insulates the adjacent blocks BLK from each other is called a slit SLT1. Similar to the slit SLT2, in the slit SLT1, a region from a surface parallel to the source line layer to at least a layer in which the wiring layer 10 is provided is embedded by the insulating film.

A plurality of memory pillars MP (MP0 to MP15) are provided between the wiring layers 10 adjacent to each other in the Y direction. The plurality of memory pillars MP are provided in a memory cell portion. Each of the plurality of memory pillars MP is provided along the Z direction. In one embodiment, for example, the Z direction is a direction orthogonal or substantially orthogonal to the XY direction, perpendicular to or substantially perpendicular to the source line layer. The Z direction is an example of the First direction. The Y direction is an example of the Second direction.

Specifically, the memory pillars MP4 and MP12 are provided between the wiring layers 10-0a and 10-1a. The memory pillars MP0 and MP8 are provided between the wiring layers 10-1a and 10-0b. The memory pillars MP5 and MP13 are provided between the wiring layers 10-0b and 10-1b. The memory pillars MP1 and MP9 are provided between the wiring layers 10-1b and 10-2a. The memory pillars MP6 and MP14 are provided between the wiring layers 10-2a and 10-3a. The memory pillars MP2 and MP10 are provided between the wiring layers 10-3a and 10-2b. The memory pillars MP7 and MP15 are provided between the wiring layers 10-2b and 10-3b. The memory pillars MP3 and MP11 are provided between the wiring layers 10-3b and 10-0c.

The memory pillar MP is a structure that form a plurality of the selection transistors ST and a plurality of memory cell transistors MT. The detailed structure of the memory pillar MP will be described later.

The memory pillars MP0 to MP3 are arranged along the Y direction. The memory pillars MP8 to MP11 are arranged along the Y direction at positions adjacent to the memory pillars MP0 to MP3 in the X direction. That is, the memory pillars MP0 to MP3 and the memory pillars MP8 to MP11 are arranged in parallel.

The memory pillars MP4 to MP7 and the memory pillars MP12 to MP15 are arranged along the Y direction. The memory pillars MP4 to MP7 are located between the memory pillars MP0 to MP3 and the memory pillars MP8 to MP11 in the X direction. The memory pillars MP12 to MP15 are located so as to interpose the memory pillars MP8 to MP11 between the memory pillars MP12 to MP15 and the memory pillars MP4 to MP7 in the X direction. That is, the memory pillars MP4 to MP7 and the memory pillars MP12 to MP15 are arranged in parallel.

The two bit lines BL0 and BL1 are provided above the memory pillars MP0 to MP3. The bit line BL0 is commonly connected to the memory pillars MP1 and MP3. The bit line BL1 is commonly connected to the memory pillars MP0 and MP2. The two bit lines BL2 and BL3 are provided above the memory pillars MP4 to MP7. The bit line BL2 is commonly connected to the memory pillars MP5 and MP7. The bit line BL3 is commonly connected to the memory pillars MP4 and MP6.

The two bit lines BL4 and BL5 are provided above the memory pillars MP8 to MP11. The bit line BL4 is commonly connected to the memory pillars MP9 and MP11. The bit line BL5 is commonly connected to the memory pillars MP8 and MP10. The two bit lines BL6 and BL7 are provided above the memory pillars MP12 to MP15. The bit line BL6 is commonly connected to the memory pillars MP13 and MP15. The bit line BL7 is commonly connected to the memory pillars MP12 and MP14.

As described above, the memory pillar MP is provided at a position across the two wiring layers 10 in the Y direction, and is provided so as to be embedded in a part of one of the plurality of slits SLT2. In addition, one slit SLT2 is provided between the memory pillars MP adjacent to each other in the Y direction.

In addition, the memory pillar MP is not provided between the wiring layers 10-0a and the wiring layers 10-0c adjacent to each other with the slit SLT1 interposed between the wiring layers 10-0a and the wiring layers 10-0c.

Figure 4:
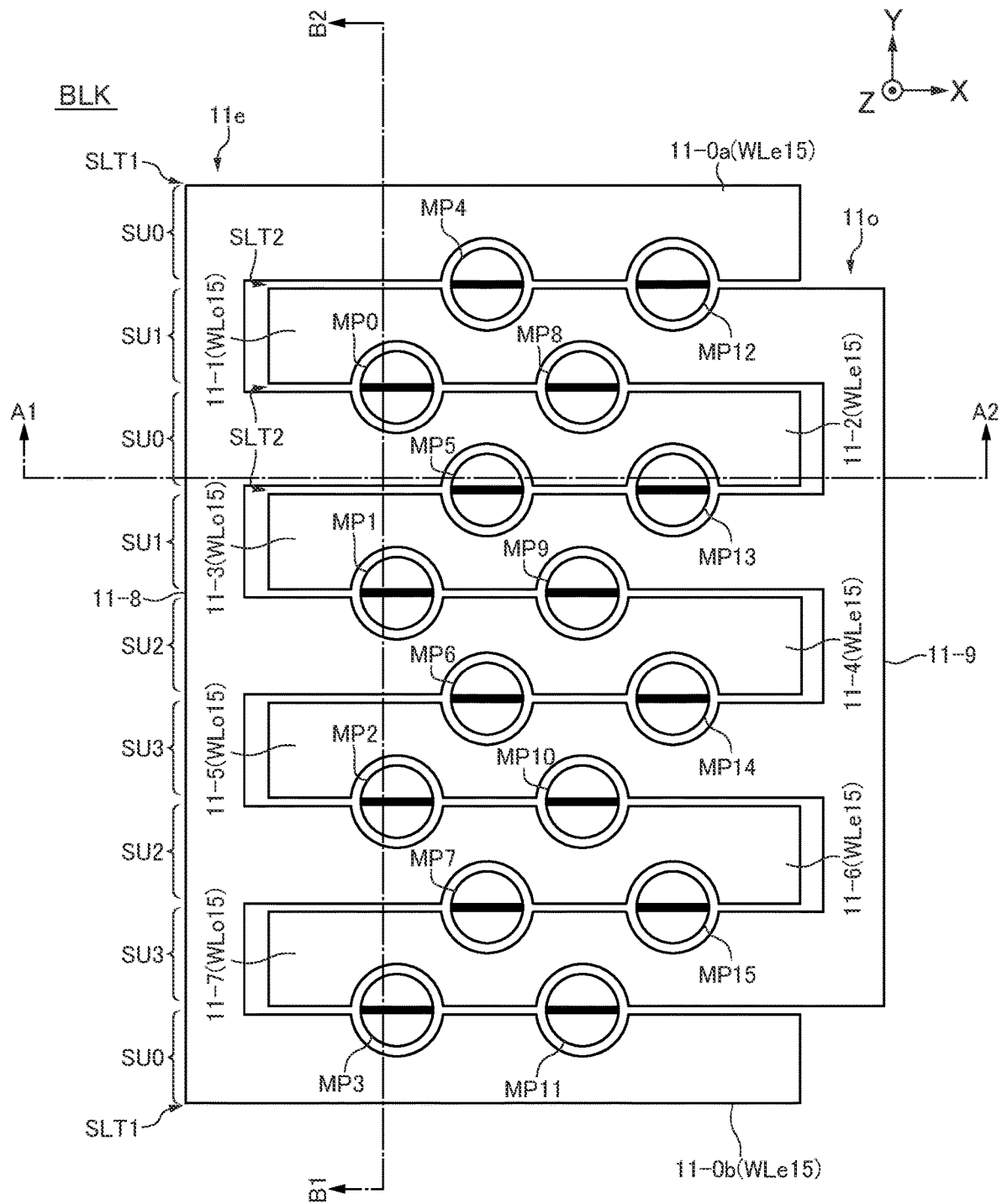
FIG. 4 is a schematic diagram showing the planar layout of word lines and memory pillars according to the first embodiment.

FIG. 4 is a diagram showing the planar layout of the word lines WL on the XY plane. The layout shown in FIG. 4 corresponds to the layout of a region of one block in FIG. 3, and is the layout of a wiring layer 11 provided below the wiring layer 10 shown in FIG. 3. The planar layout of the word lines WL according to embodiments is not limited to the layout shown in FIG. 4. In the description of FIG. 4, the description of the same or similar configuration as that of FIGS. 1 to 3 may be omitted.

As shown in FIG. 4, nine wiring layers 11 (wiring layers 11-0 to 11-7, where the wiring layer 11-0 includes a wiring layer 11-0a and a wiring layer 11-0b) extending in the X direction are arranged along the Y direction. The wiring layers 11-0 to 11-7 are arranged below the wiring layers 10-0 to 10-7 in the Z direction. An insulating film is provided between the wiring layers 11-0 to 11-7 and the wiring layers 10-0 to 10-7, so that the wiring layers 11-0 to 11-7 and the wiring layers 10-0 to 10-7 are insulated from each other.

Each wiring layer 11 functions as a word line WL15. The other word lines WL0 to WL14 also have the same configuration and function as the word line WL15. In the example shown in FIG. 4, the wiring layers 11-0a, 11-2, 11-4, 11-6, and 11-0b function as the word line WLe15. The wiring layers 11-0a, 11-2, 11-4, 11-6, and 11-0b are connected to each other using a first connection portion 11-8 extending in the Y direction. The first connecting portion 11-8 is provided at one end in the X direction. In the first connection portion 11-8, the wiring layers 11-0a, 11-2, 11-4, 11-6, and 11-0b are connected to the row decoder 29. In embodiments, the first connection portion 11-8 and the wiring layers 11-0a, 11-2, 11-4, 11-6, and 11-0b may be collectively referred to as a wiring layer 11e.

In addition, the wiring layers 11-1, 11-3, 11-5, and 11-7 function as the word line WLo15. The wiring layers 11-1, 11-3, and 11-5 and the wiring layer 11-7 are connected to each other using a second connection portion 11-9 extending in the Y direction. The second connection portion 11-9 is provided at the other end of the first connection portion 11-8 on the opposite side in the X direction. In the second connection portion 11-9, the wiring layers 11-1, 11-3, 11-5, and 11-7 are connected to the row decoder 29. In embodiments, the second connection portion 11-9 and the wiring layers 11-1, 11-3, 11-5, and 11-7 may be collectively referred to as a wiring layer 11o.

A memory cell portion is provided between the first connection portion 11-8 and the second connection portion 11-9. In the memory cell portion, the wiring layers 11 adjacent to each other in the Y direction are spaced apart from each other by the slit SLT2 shown in FIG. 3. In addition, the wiring layers 11 between the blocks BLK adjacent to each other in the Y direction are spaced apart from each other by the slit SLT1 as in the case using the slit SLT2. As in FIG. 3, the memory cell portion includes memory pillars MP0 to MP15.

Select gate line SGDL to be described later has the same configuration as select gate line SGDU shown in FIG. 3. Further, select gate line SGSU, select gate line SGSL, and the word line WL0 to WL14 described later have the same configuration as that of the word line WL15 shown in FIG. 4.

Figure 5:
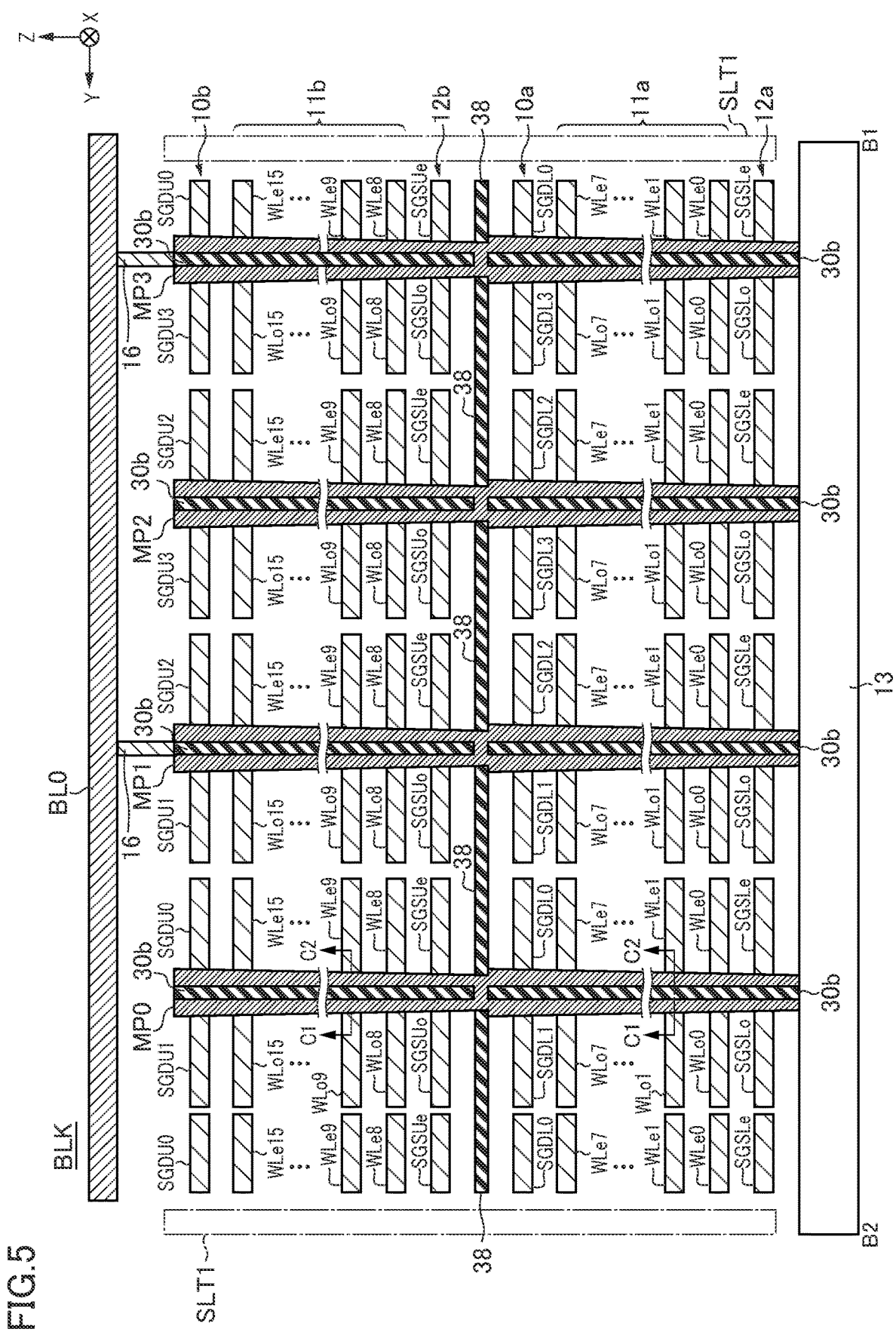
FIG. 5 is a cross-sectional view of a B1-B2 cut portion of the semiconductor memory device shown in FIGS. 3 and 4.

FIG. 5 is a cross-sectional view of a B1-B2 cut portion shown in FIG. 4. The cross-sectional view of the cut portion of the block BLK according to embodiments is not limited to the cross-sectional view of the cut portion shown in FIG. 5. In the description of FIG. 5, the description of the same or similar configuration as that of FIGS. 1 to 4 may be omitted.

As shown in FIG. 5, wiring layer 12a is provided above source line layer 13 along the Z-direction. The source line layer 13 functions as the source line SL. Incidentally, wiring layer 12a, instead of source line layer 13 shown in FIG. 5, may be provided on the p-type well regions in the semiconductor substrate. In this case, the source line SL is electrically connected to the p-type well region in the semiconductor substrate.

Wiring layer 12a functions as a select gate line SGSL. Eight layers of wiring layer 11a are laminated above wiring layer 12a along the Z-direction. Wiring layer 11a functions as a word line WL. Further, 8-layer wiring layer 11a correspond to the word line WL0 to WL7 in a one-to-one manner. Above wiring layer 11a, wiring layer 10a is provided. Wiring layer 10a functions as a select gate line SGDL. Above wiring layer 10a, wiring layer 12b is provided. Wiring layer 12b functions as a select gate line SGSU. 8-layer wiring layer 11b is stacked above the wiring layer 12b along the Z direction. Wiring layer 11b functions as a word line WL. 8-layer wiring layer 11b corresponds to the word line WL8 to WL15 in a one-to-one manner. Above wiring layer 11b, wiring layer 10b is provided. Wiring layer 10b functions as an select gate line SGDU. Further, between wiring layer 10a and wiring layer 12b, for example, an insulating layer 38 is provided. Further, in the memory pillar MP above the insulating layer 38 and in the memory pillar MP below the insulating layer 38, the insulating film 30b is provided, respectively. The semiconductor layer 31 (FIG. 7) in the memory pillar MP above the insulating layer 38 and the semiconductor layer 31 (FIG. 7) in the memory pillar MP below insulating layer 38, for example, are electrically connected to each other, in memory pillar MP between the wiring layer 10a and the wiring layer 12b. FIG. 4 shows the planar layout of wiring layer 11a, 11b, 12a and 12b functioning as the wordline WL, the select gate line SGSL and the select gate line SGSU, and FIG. 3 shows the planar layout of wiring layer 10a and 10b functioning as the select gate line SGDL and the select gate line SGDU.

Wiring layer 12a functions as an even-numbered select gate line SGSLe or odd-numbered select gate line SGSLo. The even-numbered select gate line SGSLe and the odd-numbered select gate line SGSLo are alternately arranged in the Y-direction via slit SLT2. Wiring layer 12b functions as the even-numbered select gate line SGSUe or the odd-numbered select gate line SGSUo. The even-numbered select gate line SGSUe and the odd-numbered select gate line SGSUo are alternately arranged in the Y-direction via slit SLT2. Memory pillar MPs are provided between the even-numbered select gate line SGSLe and the odd-numbered select gate line SGSLo adjacent in the Y direction and between the even-numbered select gate line SGSUe and the odd-numbered select gate line SGSUo adjacent in the Y direction.

Wiring layer 11a and 11b function as an even-numbered word line WLe or an odd-numbered word line WLo. The even-numbered word line WLe and the odd-numbered WLo are alternately arranged in the Y-direction via slit SLT2. Below insulating layer 38, even-numbered word lines WLe0-7 and odd-numbered word lines WLo0-7 are provided. Above insulating layer 38, even-numbered word lines WLe8-15 and odd-numbered word lines WLo8-15 are provided. The memory pillar MP is provided between the word lines WLe and WLo adjacent to each other in the Y direction. A memory cell, which will be described later, is provided between the memory pillar MP and the word line WLe and between the memory pillar MP and the word line WLo.

The slit SLT1 is provided between the blocks BLK adjacent to each other in the Y direction. As described above, an insulating layer is provided in the slit SLT1. However, a contact plug or a groove-like structure formed by using a conductor may be provided in the slit SLT1 that is an insulator. When a contact plug or groove-like structure formed by using a conductor is provided in the slit SLT1, a voltage can be applied to the source line layer 13. In addition, the width of the slit SLT1 along the Y direction is larger than the width of the slit SLT2 along the Y direction.

As shown in FIGS. 3 and 5, the memory pillar MP is electrically connected to the bit line BL. For example, the memory pillar MP0 and the bit line BL1 are connected to each other through a contact plug 16. In addition, the memory pillar MP1 and the bit line BL0 are connected to each other through the contact plug 16, the memory pillar MP2 and the bit line BL1 are connected to each other through the contact plug 16, and the memory pillar MP3 and the bit line BL0 are connected to each other through the contact plug 16. Similarly, each of the memory pillars MP4 to MP7 is connected to the bit line BL2 or BL3, each of the memory pillars MP8 to MP11 is connected to the bit line BL4 or BL5, and each of the memory pillars MP12 to MP15 is connected to the bit line BL6 or BL7.

Figure 6:
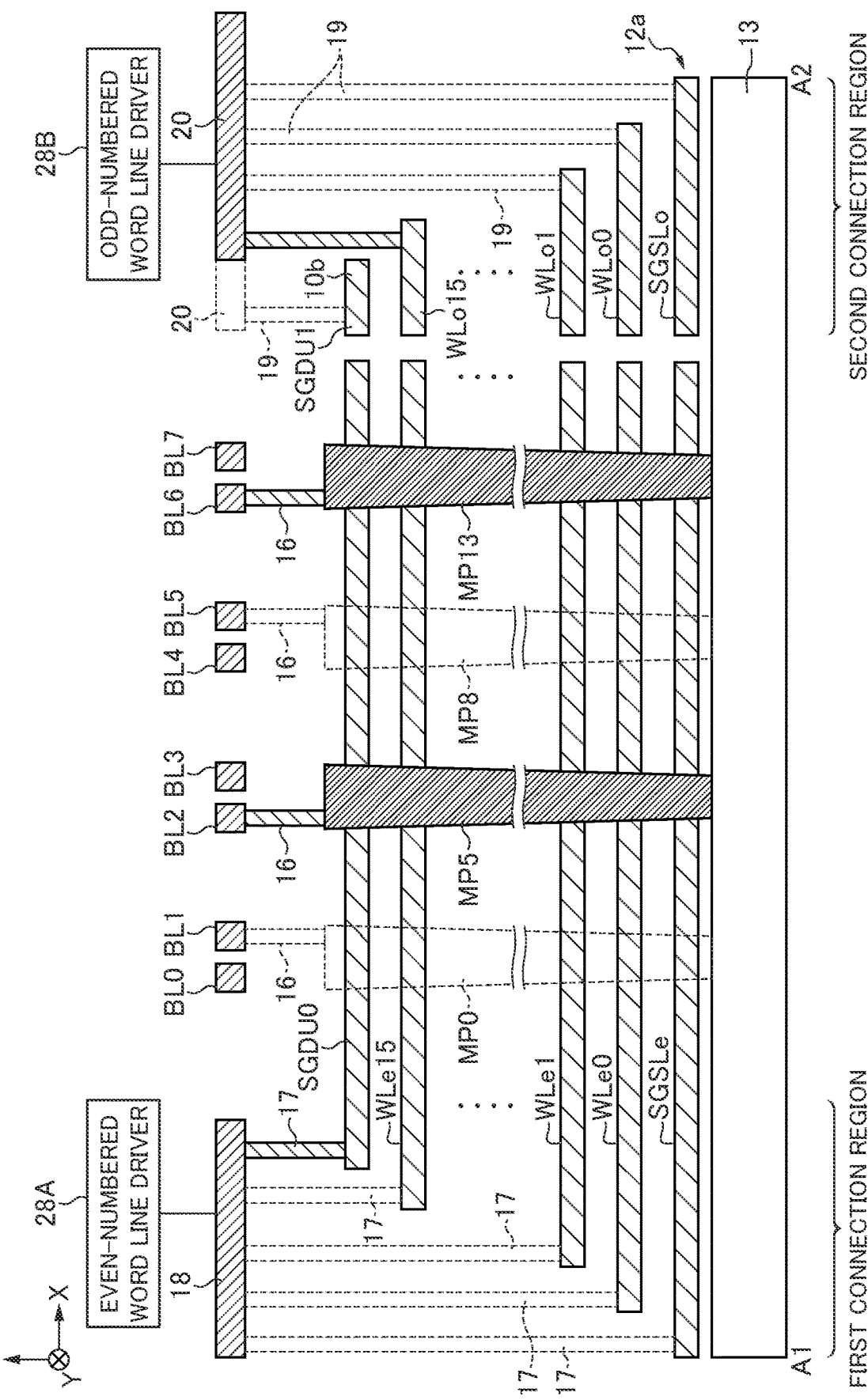
FIG. 6 is a cross-sectional view of an A1-A2 cut portion of the semiconductor memory device shown in FIGS. 3 and 4.

FIG. 6 is a cross-sectional view of an A1-A2 cut portion of the semiconductor memory device shown in FIG. 3. The cross-sectional view of the cut portion of the block BLK according to embodiments is not limited to the cross-sectional view of the cut portion shown in FIG. 6. In the description of FIG. 6, the description of the same or similar configuration as that of FIGS. 1 to 5 may be omitted. Since the stacked structure of the source line layer 13, the wiring layer 12, the wiring layer 11, and the wiring layer 10 and the configuration of the memory cell portion are the same as those described with reference to FIG. 5, the description herein will be omitted. In addition, in FIG. 6, a configuration present in the depth direction of the cross-sectional view of the A1-A2 cut portion is drawn by a dotted line.

As shown in FIG. 6, in the first connecting area, wiring layer 10, wiring layer 11, and wiring layer 12, for example, are provided in a stepped shape. That is, when viewed on the XY plane, the upper surfaces of end portions of the wiring layer 10, the 16-layer wiring layers 11, and the wiring layer 12 are exposed in the first connection region. On the upper surface of each end of wiring layer 10, 16-layer wiring layers 11 and the wiring layer 12, which are exposed in the first connecting area, contact plug 17 is provided. The contact plug 17 is connected to a metal wiring layer 18. For example, using metal wiring layer 18, wiring layer 10b functioning as even-numbered select gate line SGDU0 and SGDU2, wiring layer 10a functioning as even-numbered select gate line SGDL0 and SGDL2, wiring layer 11a and wiring layer 11b functioning as even-numbered word line WLe, wiring layer 12b functioning as even select gate line SGSUe, and wiring layer 12a functioning as even-numbered select gate line SGSLe are electrically connected to even-numbered word line drivers 28A via row decoder 29 (FIG. 1).

Similar to the first connection region, in the second connection region, the wiring layer 10, the wiring layer 11, and the wiring layer 12 are provided, for example, in a stepped shape and are drawn out from the source line layer 13. When viewed on the XY plane, the upper surfaces of end portions of the wiring layer 10, the 8-layer wiring layer 11, and the wiring layer 12 are exposed in the secondary connection region. On the top surface of the end portion of each of the wiring layer 10, the eight-layer wiring layer 11 and wiring layer 12, exposed in the second connecting area, a contact plug 19 is provided, and the contact plug 19 is connected to a metal wiring layer 20. For example, using metal wiring layer 20, the wiring layer 10b functioning as odd-numbered select gate lines SGDU1 and SGDU3, the wiring layers 11a and 11b functioning as odd-numbered wiring layers WLo, wiring layer 12b functioning as the odd-numbered select gate lines SGSUo and the wiring layer 12a functioning as the odd-numbered select gate lines SGSLo, are electrically connected to odd-numbered word line drivers 28B via the row decoder 29 (FIG. 1).

Wiring layer 10 may be electrically connected to row decoder 29 or even-numbered word line driver 28A and odd-numbered word line driver 28B via a second connection region instead of the first connection region 7, or may be electrically connected to row decoder 29 or even-numbered word line driver 28A and odd-numbered word line driver 28B via both the first connection region and the second connection region.

Figure 7:
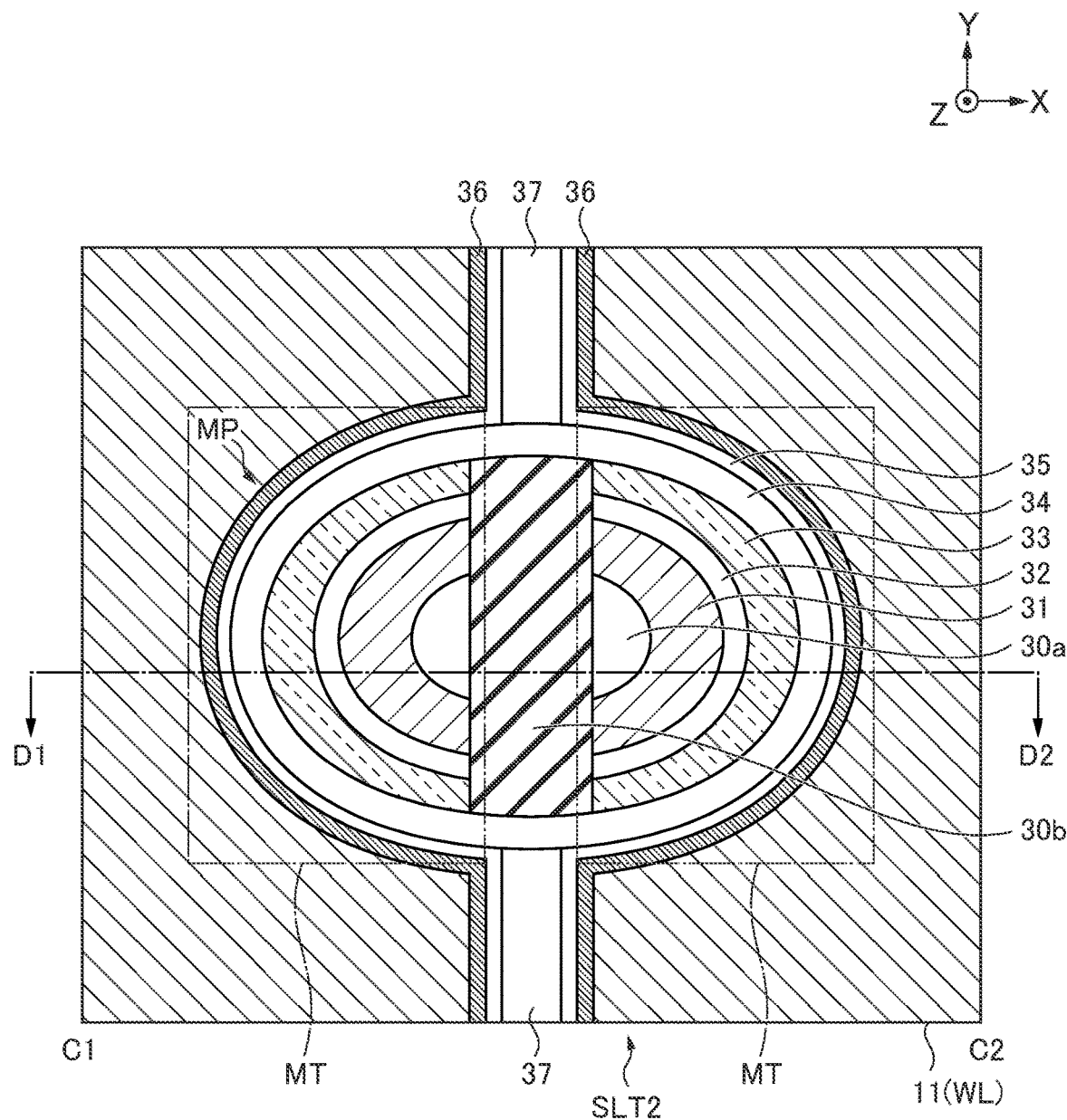
FIG. 7 is a cross-sectional view of a C1-C2 cut portion of a memory cell transistor shown in FIG. 5.
Figure 8:
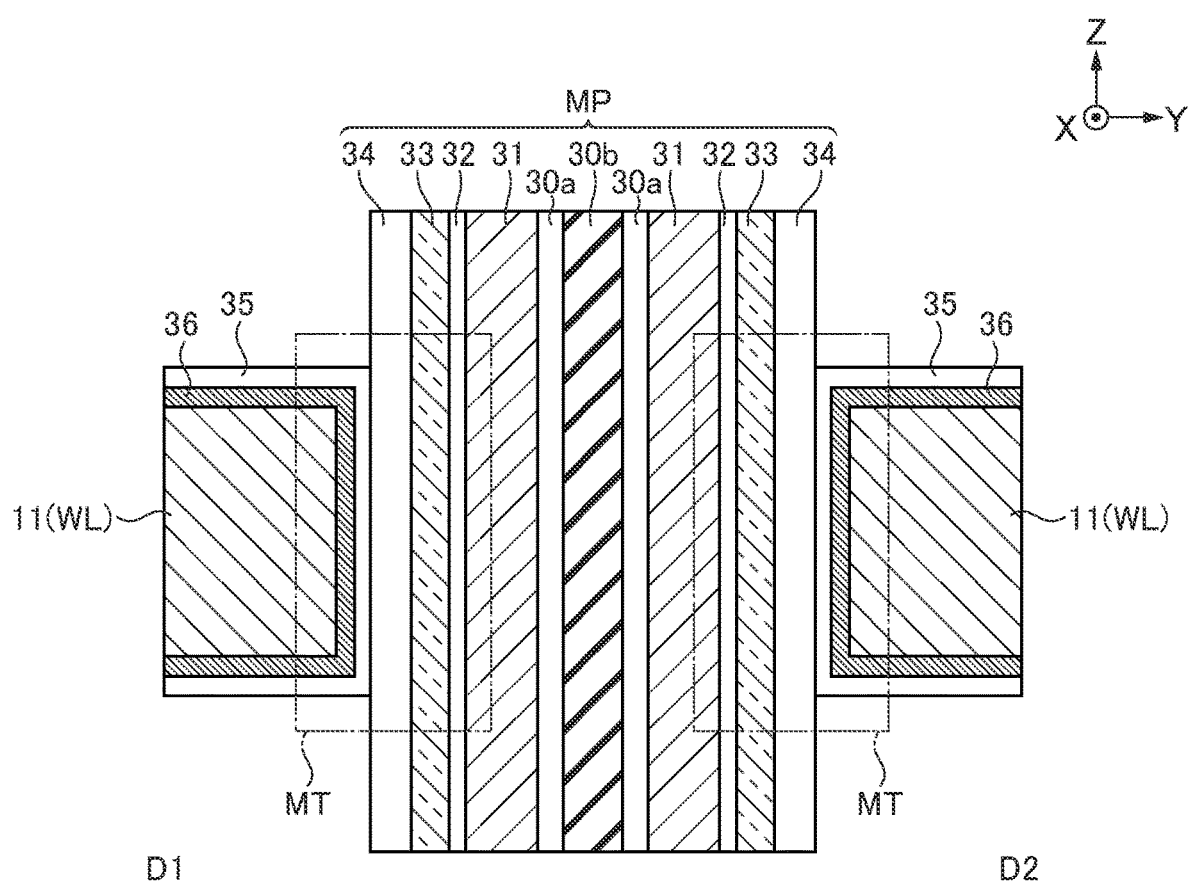
FIG. 8 is a cross-sectional view of a D1-D2 cut portion of the memory cell transistor shown in FIG. 7.

FIG. 7 is a cross-sectional view of a C1-C2 cut portion of the memory cell transistor according to embodiments, and FIG. 8 is a cross-sectional view of a D1-D2 cut portion of the memory cell transistor shown in FIG. 7. FIGS. 7 and 8 are cross-sectional views of cut portions, each of which shows a region including two memory cell transistors MT. In the first example, the charge storage layer included in the memory cell transistor MT is an insulating film. The first example of the memory cell transistor according to embodiments is not limited to the structures shown in FIGS. 7 and 8. In the description of FIGS. 7 and 8, the description of the same or similar configuration as that of FIGS. 1 to 6 may be omitted.

As shown in FIGS. 7 and 8, memory pillar MP includes a insulating layer 30a (an example of an insulator) provided along the Z direction, a insulating layer 30b (an example of an insulator) provided along the Z direction, a semiconductor layer 31, and a insulating layer 32-34. The insulating layer 30a and the insulating layer 30b are formed by using, for example, a silicon oxide film. Semiconductor layer 31 is provided on the exterior of insulating layer 30a and functions as an area where channels of memory cell transistor MTs are formed. The semiconductor layer 31 (an example of the first channel and the second channel) is formed by using, for example, a polycrystalline silicon layer. Semiconductor layer 31 is separated between memory cell transistor MTs in the same memory pillar MPs.

As noted above, semiconductor layer 31 is separated between two opposing memory cell transistor MTs. Specifically, in FIGS. 7 and 8, in memory cell transistor MT on the left side and memory cell transistor MT on the right side facing each other, the channel formed by the first memory cell and the channel formed by the second memory cell are separated from each other and insulated from each other.

The insulating layer 32 is provided on the exterior of semiconductor layer 31 and serves as a gate insulating film for the memory cell transistor MT. The insulating layer 32 is formed by using, for example, a stacked structure of a silicon oxide film and a silicon nitride film. The insulating layer 33 is provided on the exterior of the semiconductor layer 31 and serves as a charge-storage layer of the memory cell transistor MT. The insulating layer 33 is formed by using, for example, a silicon nitride film. The insulating layer 34 is provided on the exterior of the insulating layer 33 and serves as a block insulating film for memory cell transistor MTs. The insulating layer 34 is formed by using, for example, a silicon oxide film. The insulating layer 37 is embedded in the slit SLT2 excluding the memory pillar MP portion. The insulating layer 37 is formed by using, for example, a silicon oxide film. The insulating layer 33 (the charge storage layer, the charge storage film) of the memory cell transistor MT on the left side (first memory cell) facing each other and the insulating layer 33 (the charge storage layer, the charge storage film) of the memory cell transistor MT on the right side (second memory cell) is separated by, for example, the insulating layer 30b.

In the first example of embodiments, for example, an AlO layer 35 is provided around the memory pillar MP. For example, a barrier metal layer 36 is provided around the AlO layer 35. The barrier metal layer 36 is formed by using, for example, a TiN film. The wiring layer 11 that functions as the word line WL is provided around the barrier metal layer 36. The wiring layer 11 is formed by using, for example, a film formed of tungsten.

Therefore, one memory pillar MP includes two memory cell transistors MT and MT or two selection transistors ST1 and ST2 along the Y direction at a predetermined position on the Z axis.

FIG. 9 is an equivalent circuit diagram of memory pillar in the semiconductor memory device 1 according to the present embodiment. The equivalent circuit diagram of the memory pillar according to embodiments is not limited to the equivalent circuit diagram shown in FIG. 9. In the description of FIG. 9, the description of the same or similar configuration as that of FIGS. 1 to 8 may be omitted.

As shown in FIG. 9, two NAND strings 50e, 50o are formed in one memory pillar MP. NAND string 50e has the selection transistor ST1, the memory cell transistors MT0 to MT7, the selection transistor ST2, the selection transistor ST5, the memory cell transistors MT8 to MT15, and the selection transistor ST6, which are electrically connected in series. NAND string 50o has the selection transistor ST3, the memory cell transistors MT0 to MT7, the selection transistor ST4, the selection transistor ST7, the memory cell transistors MT8 to MT15, and the selection transistor ST8, which are electrically connected in series. The NAND string 50e and the NAND string 50o are provided so as to face each other. Therefore, the selection transistor ST1, memory cell transistors MT0 to MT7, the selection transistor ST2, the selection transistor ST5, the memory cell transistors MT8 to MT15, and selection transistor ST6 included in NAND string 50e, and the selection transistor ST3, the memory cell transistors MT0 to MT7, the selection transistor ST4, the selection transistor ST7, the memory cell transistors MT8 to MT15, and selection transistor ST8 included in NAND string 50o, are provided so as to face each other (opposed) on a one-to-one basis. Specifically, the selection transistor ST1 included in NAND string 50e and the selection transistor ST3 included in NAND string 50o are provided to face each other, memory cell transistors MT0 to MT7 included in NAND string 50e and memory cell transistors MT0 to MT7 included in NAND string 50o are provided to face each other in a one-to-one relationship, the selection transistor ST2 included in NAND string 50e and the selection transistor ST4 included in NAND string 50o are provided to face each other, the selection transistor ST5 included in NAND string 50e and the selection transistor ST7 included in NAND string 50o are provided to face each other, memory cell transistors MT8 to MT15 included in NAND string 50e and memory cell transistor MT8 to MT15 included in NAND string 50o are provided to face each other in a one-to-one relationship, respectively. The selection transistor ST6 included in NAND string 50e and the selection transistor ST8 included in NAND string 50o are provided so as to face each other.

In the following description, an example including two memory pillars MP, that is, a first memory pillar MP (for example, MP4 in FIG. 4) and a second memory pillar MP (for example, MP0 in FIG. 4) adjacent to the first memory pillar MP will be mainly described.

The selection transistor ST1 of NAND string 50e provided in the first memory pillar MP and the second memory pillar MP are connected to, for example, the common select gate line SGSLe, respectively. The selection transistor ST3 of NAND string 50o provided in the first memory pillar MP and the second memory pillar MP are connected to, for example, the common select gate line SGSLo, respectively. The memory cell transistors MT0 to MT7 of the NAND string 50e provided in each of the first memory pillar MP and the second memory pillar MP are connected to the common word lines WLe0 to WLe7, respectively. The memory cell transistors MT0 to MT7 of the NAND string 50o provided in each of the first memory pillar MP and the second memory pillar MP are connected to the common word lines WLo0 to WLo7, respectively. The selection transistor ST2 of NAND string 50e provided in the first memory pillar MP and the second memory pillar MP are connected to, for example, the common select gate line SGDLe0, respectively. The selection transistor ST4 of NAND string 50o provided in the first memory pillar MP and the second memory pillar MP are connected to, for example, the select gate line SGDLo1, respectively. The selection transistor ST5 of NAND string 50e provided in the first memory pillar MP and the second memory pillar MP are connected to, for example, the common select gate line SGSUe, respectively. The selection transistor ST7 of NAND string 50o provided in the first memory pillar MP and the second memory pillar MP are connected to, for example, the common select gate line SGSUo, respectively. The memory cell transistors MT8 to MT15 of NAND string 50e provided in the first memory pillar MP and the second memory pillar MP are connected to the common word line WLe8 to WLe15, respectively. The memory cell transistors MT8 to MT15 of NAND string 50o provided in the first memory pillar MP and the second memory pillar MP are connected to the common word line WLo8 to WLo15, respectively. The selection transistors ST6 of NAND string 50e provided in the first memory pillar MP and the second memory pillar MP are connected to, for example, the select gate line SGDU0, respectively. The selection transistors ST8 of NAND string 50o provided in the first memory pillar MP and the second memory pillar MP are connected to, for example, the select gate line SGDU1 or SGDU3, respectively.

In the configuration of FIG. 9, word lines WLe0 to WLe7 are connected to the shared word lines WLSe0 to WLSe7, respectively, and word lines WLe15 to WLe8 are connected to the shared word lines WLSe0 to WLSe7, respectively. The word lines WLo0 to WLo7 are connected to the shared word lines WLSo0 to WLSo7, and the word lines WLo15 to WLo8 are connected to the shared word lines WLSe0 to WLSo7, respectively.

When an example including, for example, MP6 of FIG. 4 as the first memory pillar MP and MP2 of FIG. 4 as the second memory pillar MP is considered, the selection transistor ST2 of NAND string 50e provided in the first memory pillar MP and the second memory pillar MP is connected to, for example, the common select gate line SGDLe2. The selection transistor ST4 of NAND string 50o provided in the first memory pillar MP and the second memory pillar MP are connected to, for example, the common select gate line or SGDLo3, respectively. The selection transistor ST6 of NAND string 50e provided in the first memory pillar MP and the second memory pillar MP are connected to, for example, the common select gate line SGDUs 2. The selection transistor ST8 of NAND string 50o provided in the first memory pillar MP and the second memory pillar MP are connected to, for example, the common select gate line SGDU1 or SGDU3, respectively. Otherwise, it is the same as in the case of considering MP4 of FIG. 4 as the first memory pillar, for example, and MP0 of FIG. 4 as the second memory pillar, for example.

As described above, the selection transistor ST1, the memory cell transistors MT0 to MT7, the selection transistor ST2, the selection transistor ST5, the memory cell transistors MT8 to MT15, and the selection transistor ST6 included in NAND string 50e, and the selection transistor ST3, the memory cell transistors MT0 to MT7, the selection transistor ST4, the selection transistor ST7, the memory cell transistors MT8 to MT15, and the selection transistor ST8 included in NAND string 50o corresponds, respectively.

The two NAND strings 50e and 50o in the same memory pillar MP are connected to the same bit line BL and the same source line SL.

How the select gate line SGD is selected will be described with reference to FIGS. 3 and 4. When any of the select gate line SGDU0 to SGDU3 is selected, one wiring layer 10-0 to 10-3 corresponding to each select gate line is supplied with a voltage that turns on the selection transistor ST6. For example, when wiring layer 10-1 is selected, the eight selection transistors ST6 provided in the memory pillar MP0, MP1, MP4, MP5, MP8, MP9, MP12, and MP13 are turned on. As a result, eight memory cell transistors MT belonging to the above memory pillars are selected. That is, one page is formed by the above eight memory cell transistors MT. Since the operation when a wiring layer other than the wiring layer 10-1 is selected is the same as the above, the description will be omitted.

FIG. 10 is a diagram showing another exemplary equivalent circuit diagram of memory pillar (two neighboring NAND string) in the semiconductor memory device 1 according to the present embodiment. The equivalent circuit diagram of the memory pillar according to embodiments is not limited to the equivalent circuit diagram shown in FIG. 9. In the description of FIG. 10, the description of the same or similar configuration as that of FIGS. 1 to 8 may be omitted. In this equivalent circuit diagram, the memory cell transistors MT8 to MT15 of NAND string 50e provided in the first memory pillar MP and the second memory pillar MP are connected to the common word lines WLe8 to WLe15, respectively. The memory cell transistors MT8 to MT15 of NAND string 50o provided in the first memory pillar MP and the second memory pillar MP are connected to the common word line WLo8 to WLo15, respectively. In the configuration of FIG. 10, the word lines WLe0 to WLe7 are connected to the shared word lines WLSe0 to WLSe7, respectively, and the word lines WLe8 to WLe15 are connected to the shared word line WLSe0 to WLSe7, respectively. The word lines WLo0 to WLo7 are connected to the shared word line WLSo0 to WLSo7, and the word lines WLo8 to WLo15 are connected to the shared word lines WLSe0 to WLSo7, respectively.

Other is the same as the equivalent circuit diagram shown in FIG. 9. Either the equivalent circuit diagram shown in FIG. 9 or the equivalent circuit diagram shown in FIG. 10 can be preferably used in the present embodiment. The following will be described as using the equivalent circuit diagram of FIG. 10.

In embodiments, for example, the TLC method is applied as a writing method of the memory cell transistor MT. A plurality of memory cell transistors MT to which the TLC method is applied form eight threshold distributions (write levels). The eight threshold distributions are referred to as, for example, "Er" level, "A" level, "B" level, "C" level, "D" level, "E" level, "F" level, and "G" level in order from the lowest threshold voltage. Different 3-bit data is assigned to "Er" level, "A" level, "B" level, "C" level, "D" level, "E" level, "F" level, and "G" level.

The semiconductor memory device 1 according to embodiments repeatedly executes a program loop in the write operation. The program loop includes, for example, a program operation and a verify operation. The program operation is an operation of increasing the threshold voltage of the selected memory cell transistor MT by injecting electrons into the charge storage layer in the selected memory cell transistor MT. Alternatively, the program operation is an operation of maintaining the threshold voltage of the selected memory cell transistor MT by prohibiting the injection of electrons into the charge storage layer. The verify operation is an operation of checking whether or not the threshold voltage of the selected memory cell transistor MT has reached the target level by a read operation using the verify voltage subsequent to the program operation. The selected memory cell transistor MT whose threshold voltage has reached the target level is then write-protected.

In the semiconductor memory device 1 according to embodiments, the threshold voltage of the selected memory cell transistor MT is increased to the target level by repeatedly executing the program loop including the program operation and the verify operation described above.

The electrons stored in the charge storage layer may be stored in an unstable state. Therefore, from the time when the above-described program operation is completed, the electrons stored in the charge storage layer of the memory cell transistor MT may escape from the charge storage layer with the passage of time. When the electrons escape from the charge storage layer, the threshold voltage of the memory cell transistor MT decreases. Therefore, in the read operation executed after the write operation is completed, in order to cope with such a decrease in the threshold voltage of the memory cell transistor that may occur with the passage of time, the read operation is performed using a read voltage lower than the verify voltage. The read operation may include a verify operation.

Figure 11:
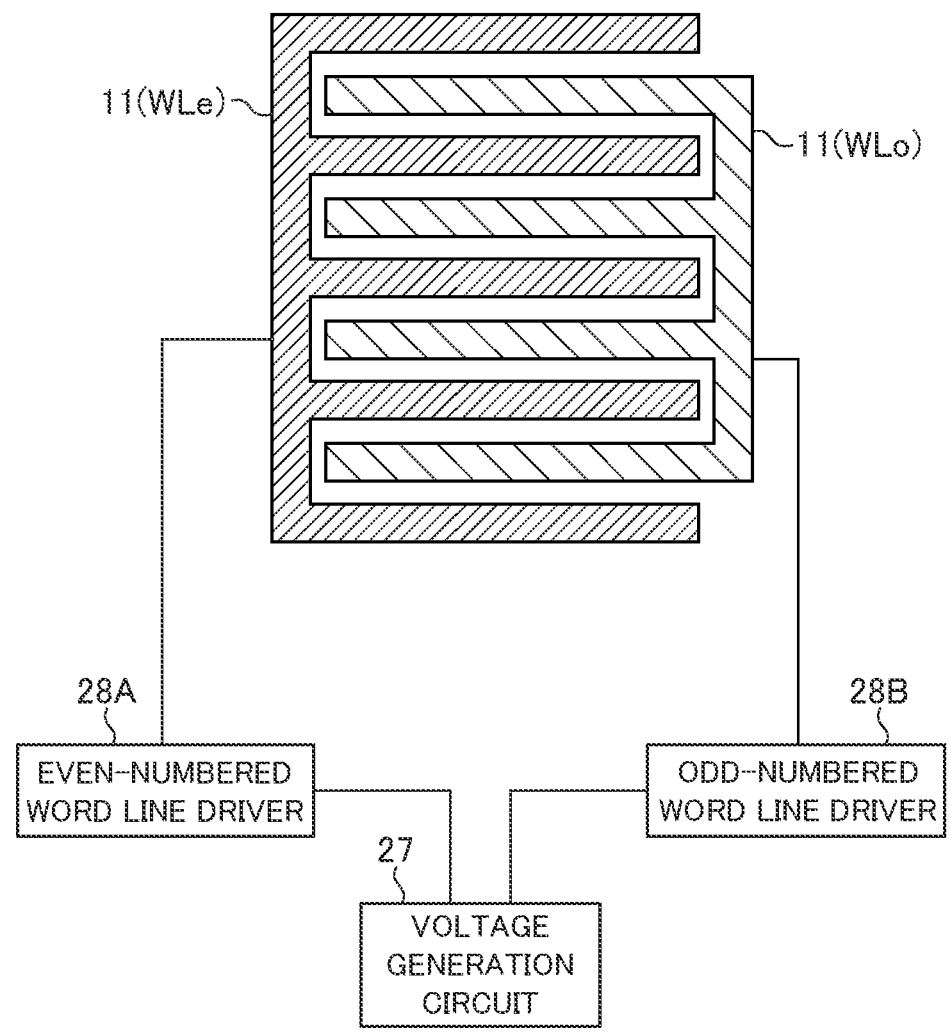
FIG. 11 is a diagram for explaining the electrical connection of a voltage generation circuit, a driver set, a select gate line, or a word line according to the first embodiment.

FIGS. 11 and 12 are diagrams for explaining the electrical connection of the sequencer 24, the voltage generation circuit 27, the driver set 28, the row decoder 29, the select gate line SGD or the word line WL according to embodiments. The sequencer 24, the voltage generation circuit 27, the driver set 28, the row decoder 29, the select gate line SGD or the word line WL according to the present embodiment is not limited to the plane shown in FIG. 11. In the description of FIGS. 11 and 12, the description of the same or similar configuration as that of FIGS. 1 to 10 may be omitted. A circuit including the sequencer 24, the voltage generation circuit 27, the driver set 28, and the row decoder 29 is an example of a control circuit.

As shown in FIG. 11, the wiring layer 11 functioning as even-numbered word line WLe (or even-numbered shared word line WLSe) may be connected to even-numbered word line driver 28A, and wiring layer 11 functioning as odd-numbered word line WLo (or odd-numbered shared word line WLSo) may be electrically connected to odd-numbered word line driver 28B. As described above, the even-numbered word line driver 28A and the odd-numbered word line driver 28B are included in driver set 28. The driver set 28 is electrically connected to the voltage generation circuit 27. As shown in FIGS. 11 and 12, the even-numbered word line driver 28A, and the odd-numbered word line driver 28B may generate various voltages using a voltage supplied from the voltage generation circuit 27. The even-numbered word line driver 28A may supply the generated voltages to the even-numbered word lines WLe of the respective blocks BLK via the row decoder 29A. Further, the odd-numbered word line driver 28B may supply the generated voltages to the odd-numbered word lines WLo of the respective blocks BLK via row decoder 29B. The row decoder 29A and the row decoder 29B are included in the row decoder 29.

As shown in FIG. 12 and as described above, the sequencer 24 can execute various operations, such as a write operation and a read operation, by controlling the driver set 28 and the like.

Figure 13:
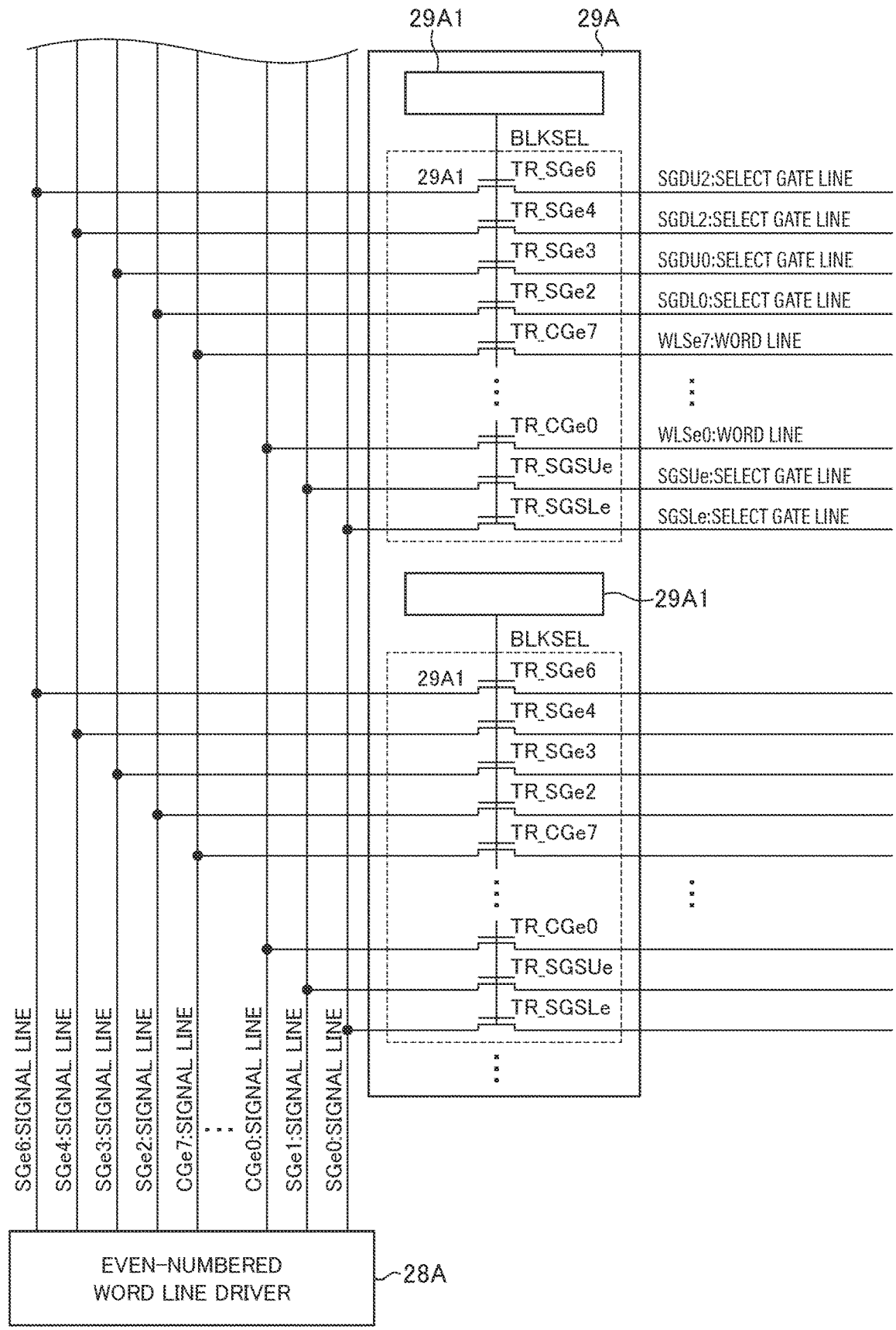
FIG. 13 is a schematic diagram for explaining an electric connection between even-numbered word line drivers and row decoder according to the first embodiment.

FIG. 13 is a schematic diagram for explaining the electric connections between the even-numbered word line driver 28A and the row decoders 29A according to the present embodiment.

The signal line SGe0, the signal line SGe1, the signal line SGe2, the signal line SGe3, the signal line SGe4, the signal line SGe6 and signal line CGe as the signal line CG0, . . . CG7 are connected to the even-numbered word line driver 28A. For the signal line CGe, for example, the same number of signal lines CGe as the number of even-numbered shared word lines WLSe in the block BLK are connected.

The signal line SGe0 is connected to the even-numbered select gate line SGSLe in each block BLK through a transistor TR_SGe0. The transistor TR_SGe0 functions as a switch for turning on/off the signal from the signal line SGe0 using a block decoder 29A1.

The signal line SGe1 is connected to the select gate line SGSUe in each block BLK through a transistor TR_SGe1. The transistor TR_SGe1 functions as a switch for turning on/off the signal from the signal line SGe1 using the block decoder 29A1.

The signal lines CGe0, . . . , CGe7 are connected to the even-numbered shared word lines WLSe0, . . . , WLSe7 in each block BLK through transistors TR_CGe0, . . . , TR_CGe7, respectively. The transistors TR_CGe0, . . . , TRCGe7 function as switches for turning on/off the signal from signal line CGe0, . . . , CGe7 using the block decoder 29A1.

The signal line SGe2 is connected to the select gate line SGDL0 in each block BLK through a transistor TR_SGe2. The transistor TR_SGe2 functions as a switch for turning on/off the signal from the signal line SGe2 using the block decoder 29A1.

The signal line SGe3 is connected to the select gate line SGDU0 in each block BLK through a transistor TR_SGe3. The transistor TR_SGe3 functions as a switch for turning on/off the signal from the signal line SGe3 using the block decoder 29A1.

The signal line SGe4 is connected to the select gate line SGDL2 in each block BLK through the transistor TR_SGe4. The transistor TR_SGe4 functions as a switch to turn on/off the signal from signal line SGe4 by block decoder 29A1.

The signal line SGe6 is connected to the select gate line SGDU2 in each block BLK via a transistor TR_SGe6. The transistor TR_SGe6 functions as a switch to turn on/off the signal from the signal line SGe6 by the block decoder 29A1.

Figure 14:
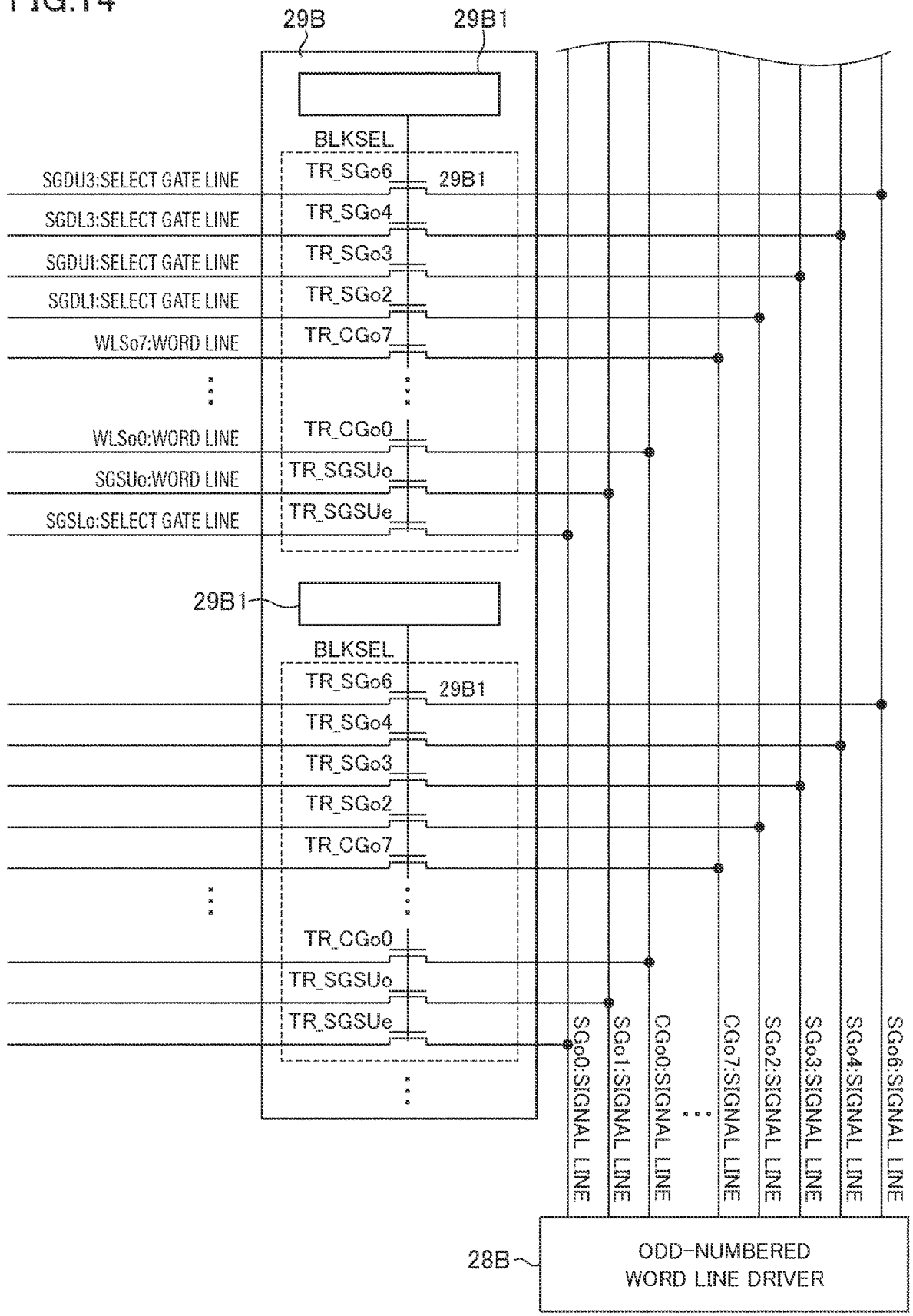
FIG. 14 is a schematic diagram for explaining an electric connection between odd-numbered word line drivers and row decoder according to the first embodiment.

FIG. 14 is a schematic diagram for explaining the electric connection of the odd-numbered word line drivers 28B and the row decoder 29B according to the present embodiment.

The signal line SGo0, the signal line SGo1, the signal line SGo2, the signal line SGo3, the signal line SGo4, the signal line SGo6, and the signal lines CG0, . . . , CGo7 as the signal line CGo, are connected to the odd-numbered word line drivers 28. For signal line CGo, for example, the same number of signal lines CGo as the number of odd-numbered shared word lines WLSo in the block BLK are connected to the block BLK.

The signal line SGo0 is connected to the odd select gate line SGSLo in each block BLK via the transistor TR_SGo0. The transistor TR_SGo0 functions as a switch for turning on/off the signal from the signal line SGo0 using a block decoder 29B1.

The signal line SGo1 is connected to the odd select gate line SGSUo in each block BLK via the transistor TR_SGo1. The transistor TR_SGo1 functions as a switch for turning on/off the signal from the signal line SGo1 using the block decoder 29B1.

The signal lines CGo0, . . . , CGo7 are connected to the odd-numbered shared word line WLSo0, . . . , WLSo7 in each block BLK through the transistors TR_CGo0, . . . , TRCGo7. Transistors TR_CGo0, . . . , TRCGo7 function as switches to turn on/off the signals from signal line CGo0, . . . , CGo7 by the block decoder 29B1.

The signal line SGo2 is connected to the select gate line SGDL1 in each block BLK through the transistor TR_SGo2. The transistor TR_SGo1 functions as a switch to turn on/off the signals from the signal line SGo2 by the block decoder 29B1.

The signal line SGo3 is connected to the select gate line SGDU1 in each block BLK through a transistor TR_SGo3. The transistor TR_SGo3 functions as a switch for turning on/off the signal from the signal line SGo3 by the block decoder 29B1.

The signal line SGo4 is connected to the select gate line SGDL3 in each block BLK through a transistor TR_SGo4. The transistor TR_SGo4 functions as a switch for turning on/off the signal from the signal line SGo4 by the block decoder 29B1.

The signal line SGo6 is connected to the select gate line SGDU3 in each block BLK through the transistor TR_SGo6. The transistor TR_SGo6 functions as a switch for turning on/off the signal from the signal line SGo6 by the block decoder signal 29B1.

Figure 15:
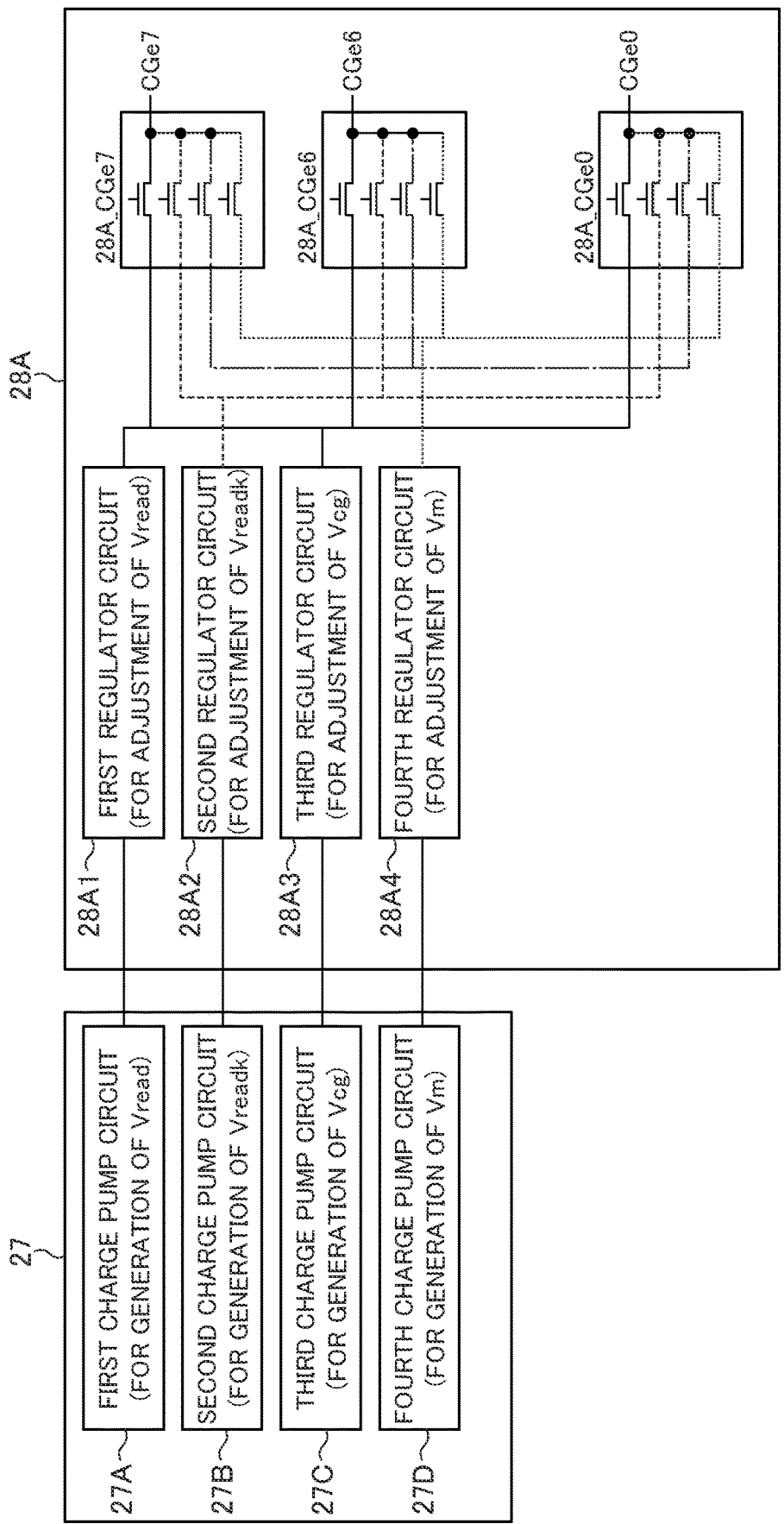
FIG. 15 is a schematic diagram for explaining the electrical connections of voltage generation circuit 27 and even-numbered word line drivers 28 according to the first embodiment.

FIG. 15 is a schematic diagram for explaining the electric connection of the voltage generation circuit 27 and the even-numbered word line drivers 28A according to the present embodiment.

Vread, VreadK, Vcg and Vm as voltages, described below, are generated, for example, by a charge pump circuit 27A, a second charge pump circuit 27B, a third charge pump circuit 27C and a fourth charge pump circuit 27D in the voltage generation circuit 27, respectively. Vread, VreadK, Vcg and Vm are held by the first regulator circuit 28A1, the second regulator circuit 28A2, the third regulator circuit 28A3, and the fourth regulator circuit 28A4 in the even-numbered word line driver 28A, respectively. Thereafter, Vread, VreadK, Vcg and Vm are appropriately added and supplied to the signal line CGe0, . . . , CGe7.

Figure 16:
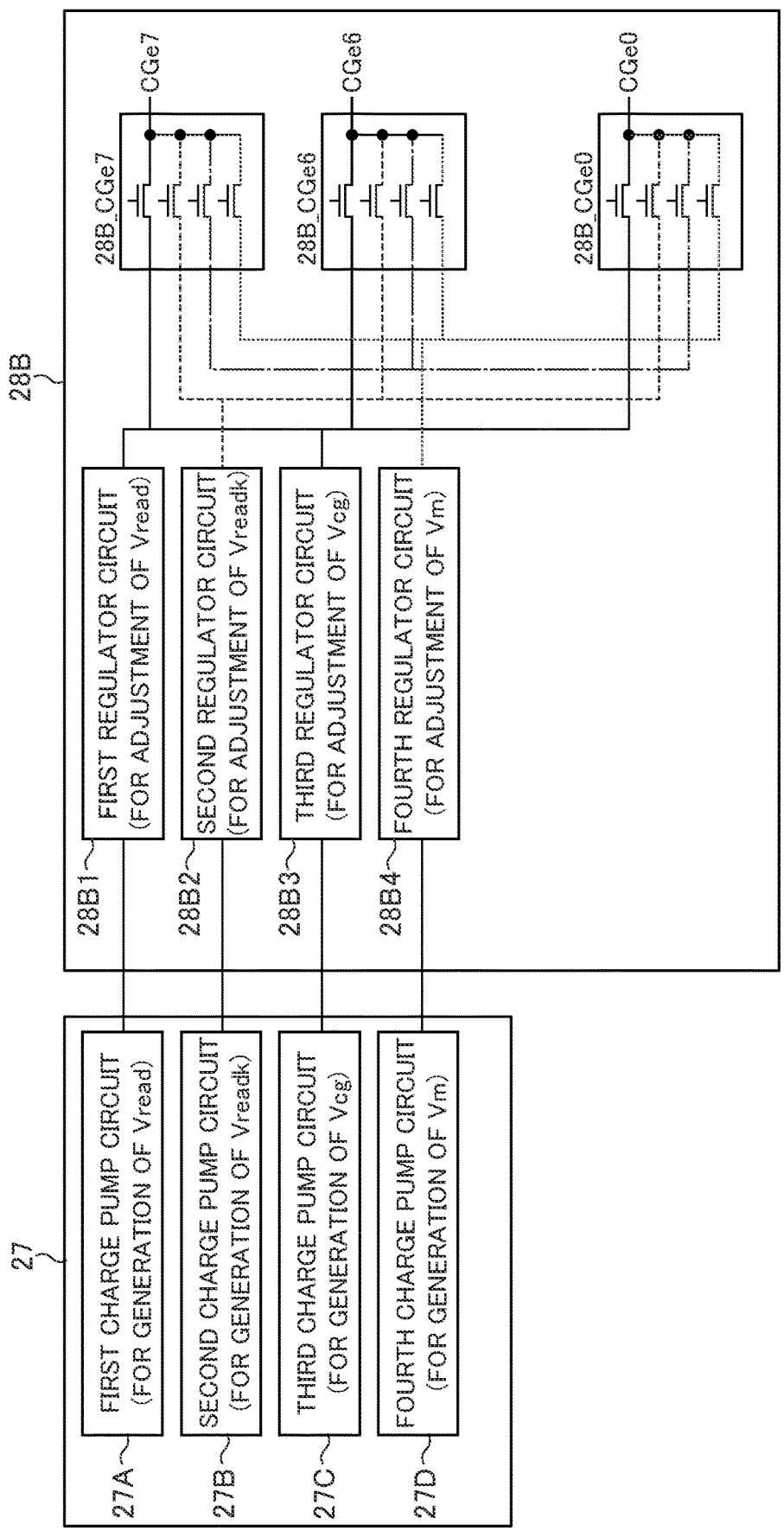
FIG. 16 is a schematic diagram for explaining the electrical connections of voltage generation circuit 27 and odd-numbered word line drivers 28 according to the first embodiment.

FIG. 16 is a schematic diagram for explaining the electric connection of the voltage generation circuit 27 and the odd-numbered word line drivers 28B according to the present embodiment.

Vread, VreadK, Vcg and Vm are held by the first regulator circuit 28B1, the second regulator circuit 28B2, the third regulator circuit 28B3 and the fourth regulator circuit 28B4 in the odd-numbered word line driver 28B, respectively. Thereafter, Vread, VreadK, Vcg and Vm are appropriately added and supplied to the signal line CGe0, . . . , CGe7.

Note that Vpgm, Vpass and VSGD as voltages, which will be described later, can also be supplied to the wires in the same manner.

First Embodiment

Figure 17:
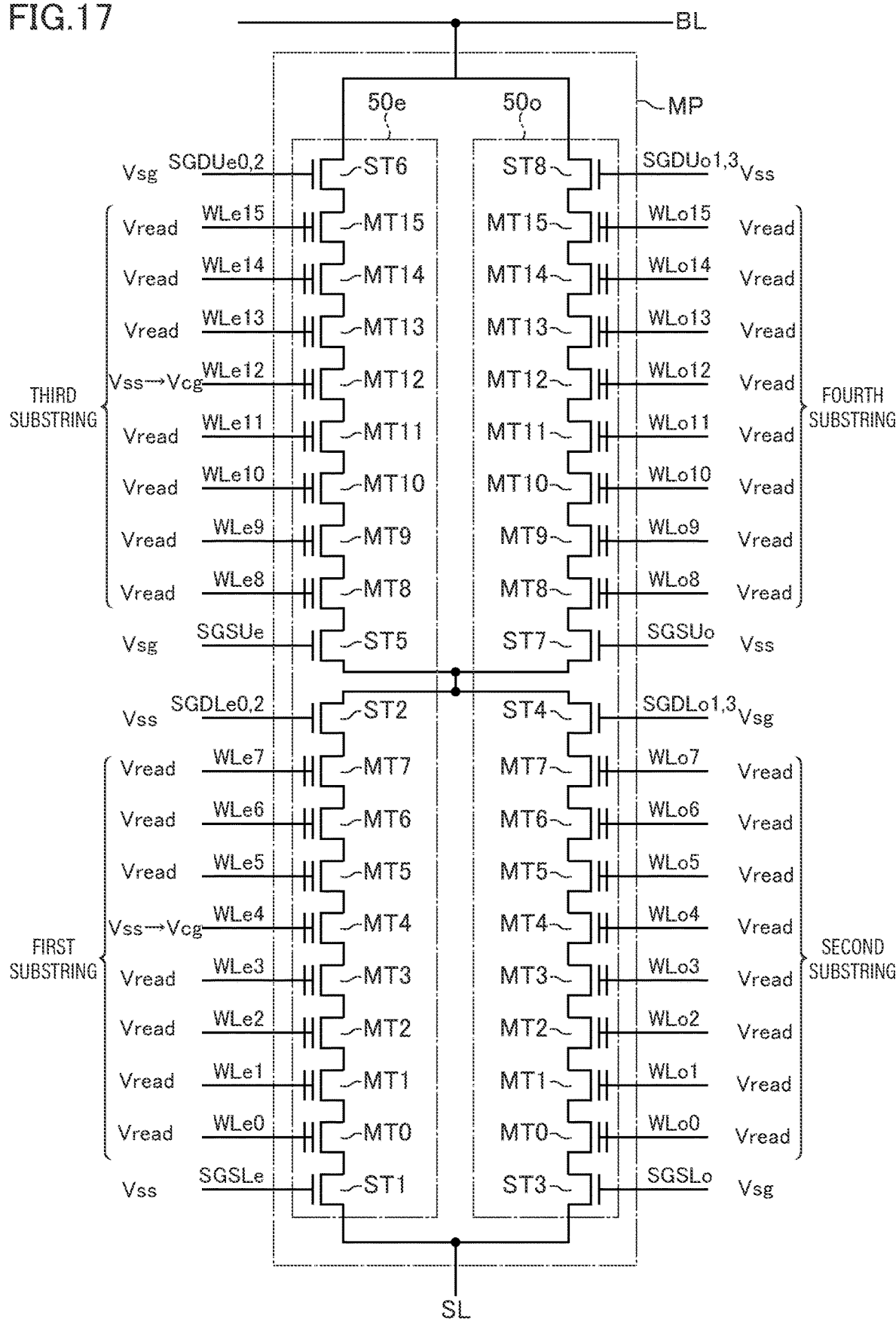
FIG. 17 is a diagram schematically illustrating an equivalent circuit of memory pillar and a voltage applied to each memory cell transistor via a word line in the semiconductor memory device of the first embodiment.

FIG. 17 is a diagram schematically showing equivalent circuits of memory pillar (two neighboring NAND string) and voltages applied to each memory cell transistor via word lines in semiconductor memory device of the present embodiment. Incidentally, the voltage describes a voltage in the third operation to be described later.

Here, the selection transistor ST1, the selection transistor ST2 and the memory cell transistors MT0 to MT7 connected between the selection transistor ST1 and the selection transistor ST2 is referred to as the first substring. The selection transistor ST3, the selection transistor ST4 and the memory cell transistors MT0 to MT7 connected between the selection transistor ST3 and the selection transistor ST4 is referred to as the second substring. The selection transistor ST5, the selection transistor ST6 and the memory cell transistors MT8 to MT15 connected between the selection transistor ST5 and the selection transistor ST6 is referred to as the third substring. The selection transistor ST7, the selection transistor ST8 and the memory cell transistors MT8 to MT15 connected between the selection transistor ST7 and the selection transistor ST8 is referred to as the fourth substring.

Also, as noted above, it is assumed here that the equivalent schematic of FIG. 10 is used, i.e., the memory transistors MT0 to MT7 of NAND string 50e and memory cell transistors MT8 to MT15 of NAND string 50e are connected to the common shared word lines WLSe0 to WLSe7, respectively. The memory transistors MT0 to MT7 of the NAND string 50o and the memory cell transistor MT8 to MT15 of the NAND string 50e are connected to the common shared word lines WLSo0 to WLSo7, respectively.

FIGS. 18A-C are diagrams schematically showing a timing chart of various signals at the time of data reading operation in the semiconductor memory device of the present embodiment.

FIG. 18A is a diagram schematically showing a voltage applied to the select gate line SGs. FIG. 18B is a diagram schematically showing a voltage applied to the shared word line WLSes. FIG. 18C is a diagram schematically showing a voltage applied to the shared word line WLSo.

As an example, in the third substring of NAND string 50e, the read operation of the memory cell transistor MT12 having the gate connected to the wordline WLe12 (shared word line WLSe4) is illustrated.

Hereinafter, Vss is an example of the first voltage and the seventh voltage, Vsg is an example of the second voltage, Vcg is an example of the third voltage, Vread is an example of the fourth voltage, Vpgm is an example of the fifth voltage, Vpass is an example of the sixth voltage, Vdd is an example of the eighth voltage.

In addition, Vss is, for example, about 0V, Vsg is, for example, about 2.5V, Vcg is, for example, about 1V, Vread is, for example, about 5V, Vpgm is, for example, about 20V, Vpass is, for example, about 10V, and Vdd is, for example, about 2.5V. However, each of the above voltages is an example, and the present invention is not limited thereto.

Hereinafter, the read operation of the memory cell transistor MT12 will be described on the assumption that, for example, the first operation, the second operation, and the third operation are performed. Here, the second operation is performed after the first operation, and the third operation is performed after the second operation.

First, the first operation will be described. Vsg is applied to the select gate lines SGDU0, SGDU1, SGDU2, SGDU3, SGSUe, SGSUo, SGDL0, SGDL1, SGDL2, SGDL3, SGSLe and SGSUo. Thus, the selection transistor ST8, the selection transistor ST7, selection transistor ST6, selection transistor ST5, selection transistor ST4, selection transistor ST3, selection transistor ST2 and selection transistor ST1 will be turned on.

In addition, in the first operation, Vread is applied to the shared word lines WLSe0 to WLSe7 and the shared word lines WLSo0 to WLSo7. Vread is the voltage applied to the non-selected word line during the read operation, and is the voltage to turn on the memory cell transistor MT regardless of the holding data.

Next, in the second operation, Vss is applied to the shared word line WLSe4.

Next, in the third operation, Vcg higher than Vss is applied to the shared word line WLSe4. In addition, Vsg is applied to the select gate lines SGDU2, SGSUe, SGDL1, SGDL3, and SGSLo. Therefore, the selection transistors ST6, ST5, ST4 and ST3 will be turned on. In addition, Vss is applied to the select gate lines SGDU0, SGDU1, SGDU3, SGSUo, SGDL0, SGDL2 and SGSLe. Therefore, the selection transistors ST8, ST7, ST2 and ST1 will be turned off. Then, the third substring and the second substring are energized. On the other hand, the first substring and the fourth substring are not energized.

Thus, in the third substring, only from memory cell transistor MT12 of which Vcg is applied to the gate, the read operation is performed. In the first substring, Vcg is also applied the gate of the memory cell transistor MT4. However, since the selection transistor ST1 and the selection transistor ST2 are turned off, the read operation is not performed.

Figure 19:
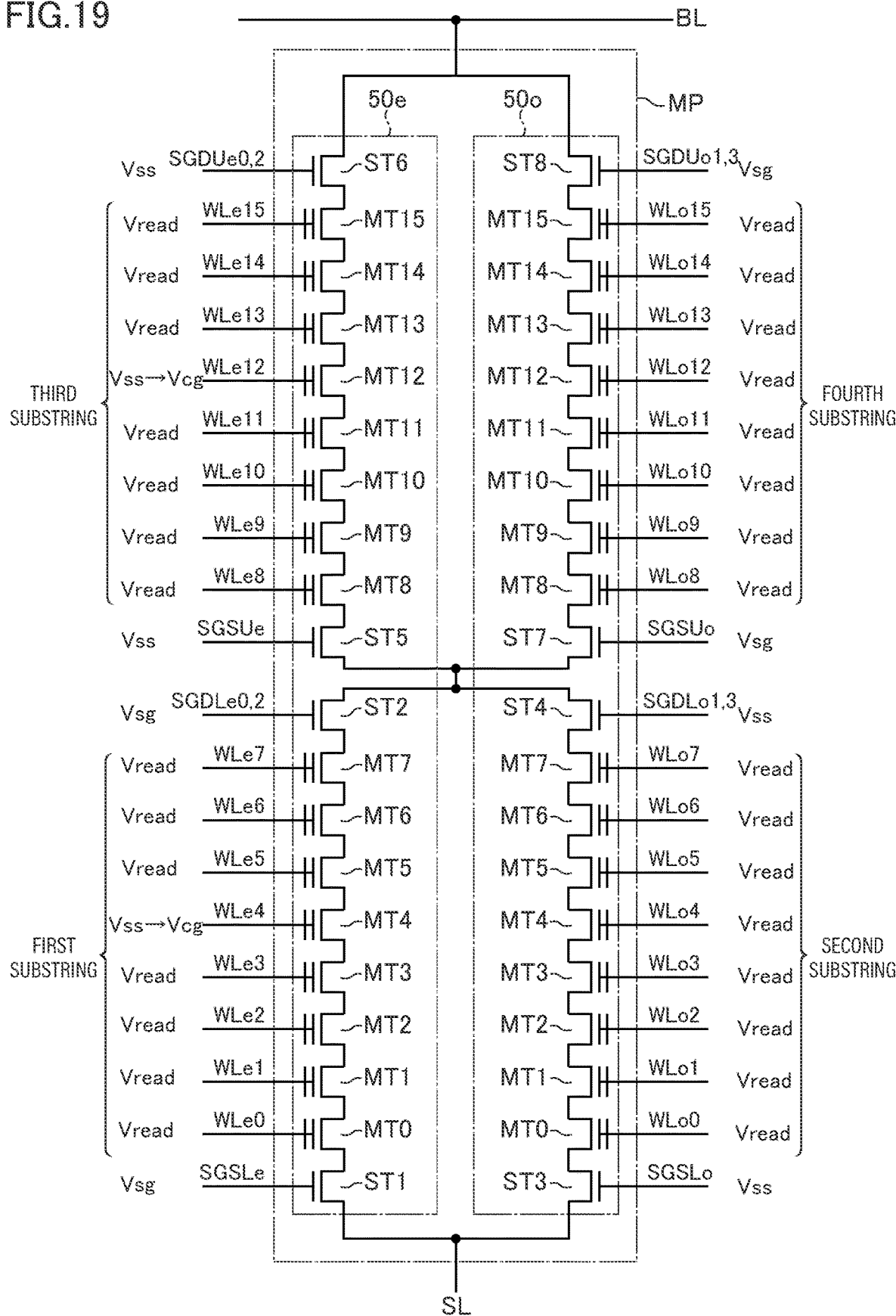
FIG. 19 is a diagram schematically illustrating an equivalent circuit of memory pillar and a voltage applied to each memory cell transistor via a word line in the semiconductor memory device of the first embodiment.

FIGS. 20A-C are diagrams schematically showing a timing chart of various signals at the time of data reading operation in the semiconductor memory device of the present embodiment. FIG. 19 is a diagram schematically showing equivalent circuits of the memory pillar (two neighboring NAND string) and voltages applied to each memory cell transistor via word lines in the semiconductor memory device of the present embodiment. Incidentally, the voltage describes a voltage in the third operation to be described later.

Here, as an example, an example of the read operation of the memory cell transistor MT4 whose gates are connected to the word line WLe4 (shared word line WLSe4) in the first substring of NAND string 50e is shown.

The first operation and the second operation are the same as those shown in FIGS. 18A-C.

Next, in the third operation, Vcg higher than Vss is applied to the shared word line WLSe4. In addition, Vsg is applied to the select gate lines SGDU1, SGSUo, SGDL0, SGDL2, and SGSLe. Thus, the selection transistors ST8, ST7, ST2 and ST1 are turned on. In addition, Vss is applied to the select gate lines SGDU0, SGDU2, SGDU3, SGSUe, SGDL1, SGDL3 and SGSLo. Thus, the selection transistors ST6, ST5, ST4 and ST3 are turned off. Then, the fourth substring and the first substring are energized. On the other hand, the third substring and the second substring are not energized.

Thus, in the first substring, only from memory cell transistor MT4 of which Vcg is applied to the gate, the read operation is performed. In the third substring, Vcg is also applied the gate of the memory cell transistor MT12. However, since the selection transistor ST6 and selection transistor ST5 are turned off, the read is not performed.

Next, the operation and effects of semiconductor memory device of the present embodiment will be described.

As the density of semiconductor memory device increases, the number of stacks of word lines WL increases. Here, the respective word lines WL are provided with the transistors TR_CGe0, . . . , CGe7 and TR_CGo0, . . . , CGo7 which function as switches for turning on/off the signals from the signal lines CGe0, . . . , CGe7 and CGo0, . . . , CGo7, as described with FIGS. 13 and 14. Such transistors are provided, for example, by the product of the number of blocks BLK and the number of word lines in each block BLK. Therefore, as the density of semiconductor memory device is increased, the number of transistors TR_CG connected to the word lines WL increases, which may adversely hinder the density of the word line WL.

Therefore, in semiconductor memory device of the present embodiment, the word line WL in the first substring and the word line WL in the third memory cell string are respectively connected. In other words, the word line WL in the first substring and the word line WL in the third memory cell string are commonly controlled as the shared word line WLS. As a result, the number of transistors TR_CG connected to the word line WL can be reduced to, for example, half. Therefore, the density of semiconductor memory device can be increased.

According to semiconductor memory device of the present embodiment, it is possible to provide a semiconductor memory device capable of high density.

Second Embodiment

Figure 21:
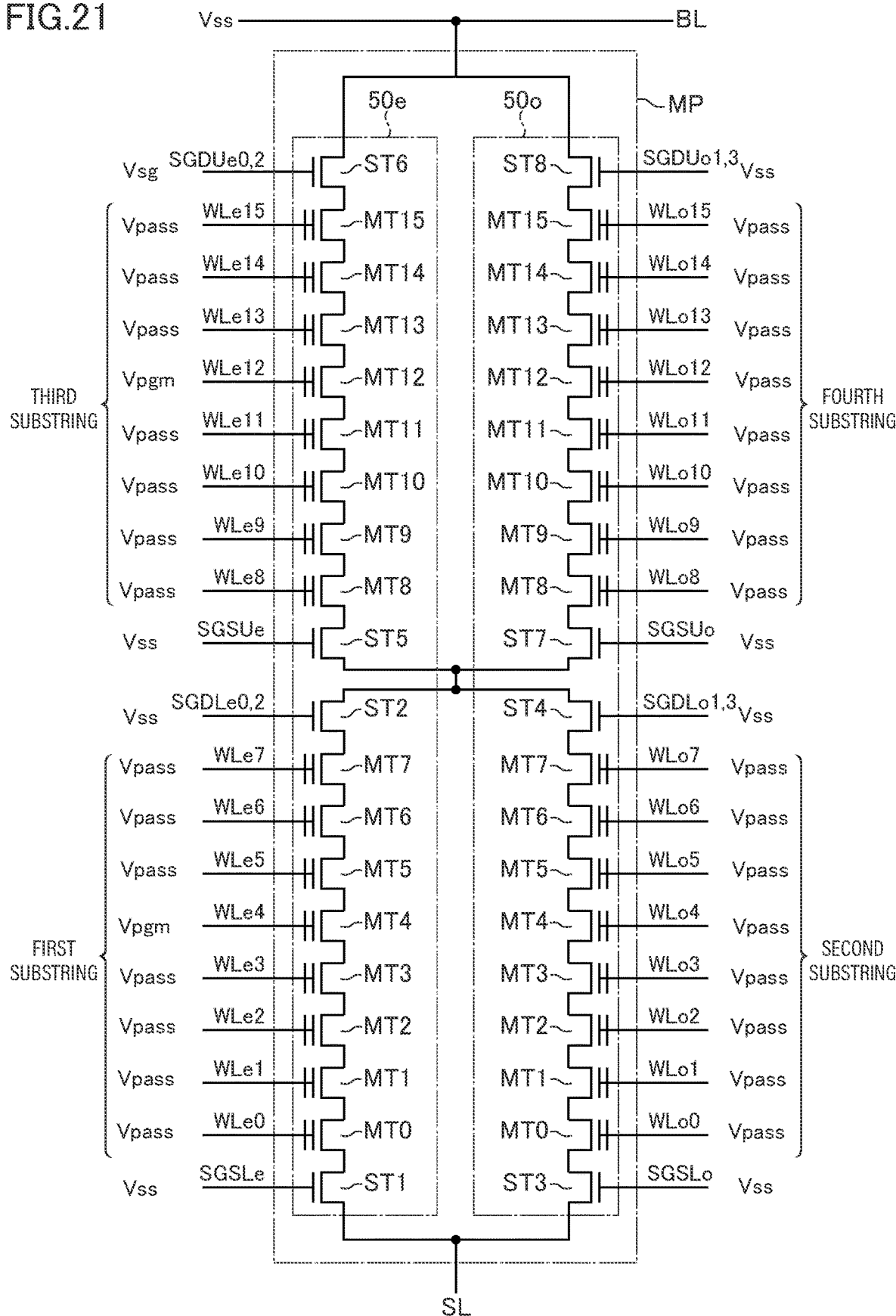
FIG. 21 is a diagram schematically illustrating an equivalent circuit of memory pillar and a voltage applied to each memory cell transistor via a word line in a first example of the semiconductor memory device of the second embodiment.

FIG. 21 is a diagram schematically showing equivalent circuits of the memory pillar (two neighboring NAND string) and voltages applied to each memory cell transistor via the word lines in the semiconductor memory device of the present embodiment.

As a first example of the present embodiment, an example of the write operation of the memory cell transistor MT12 whose gate is connected to the word line WLe12 (shared word line WLSe4) in the third substring of NAND string 50e is shown.

Vsg is applied to the select gate line SGDU0 and the selection transistor ST6 is turned on. On the other hand, by applying Vss to the other select gate lines, the selection transistor ST1, the selection transistor ST2, the selection transistor ST3, the selection transistor ST4, the selection transistor ST5, the selection transistor ST7 and the selection transistor ST8 are turned off.

Further, Vpgm is applied to the shared word line WLSe4. Further, Vpass is applied to the shared word line WLSe0-3, WLSe5-7 and WLSo0-7. Further, Vss is applied to the bit line BL. As a result, the write operation is performed on the memory cell transistor MT12 of the third substring. Incidentally, in the first substring, Vpgm is also applied to the gate of the memory cell transistor MT4. However, the channels of memory cell transistor MTs of the first substring are electrically floating. The electrically floating channel is coupled with a word line WL to which Vpass or Vpgm is applied, and the voltage of the channel is increased to the boost voltage Vboost. Therefore, the write operation to memory cell transistor MT4 is not performed. Note that the voltage of the channel of the memory cell transistors MT of the second substring and the voltage of the channel of the memory cell transistors MT of the fourth substring are also increased to the boost voltage Vboost.

Figure 22:
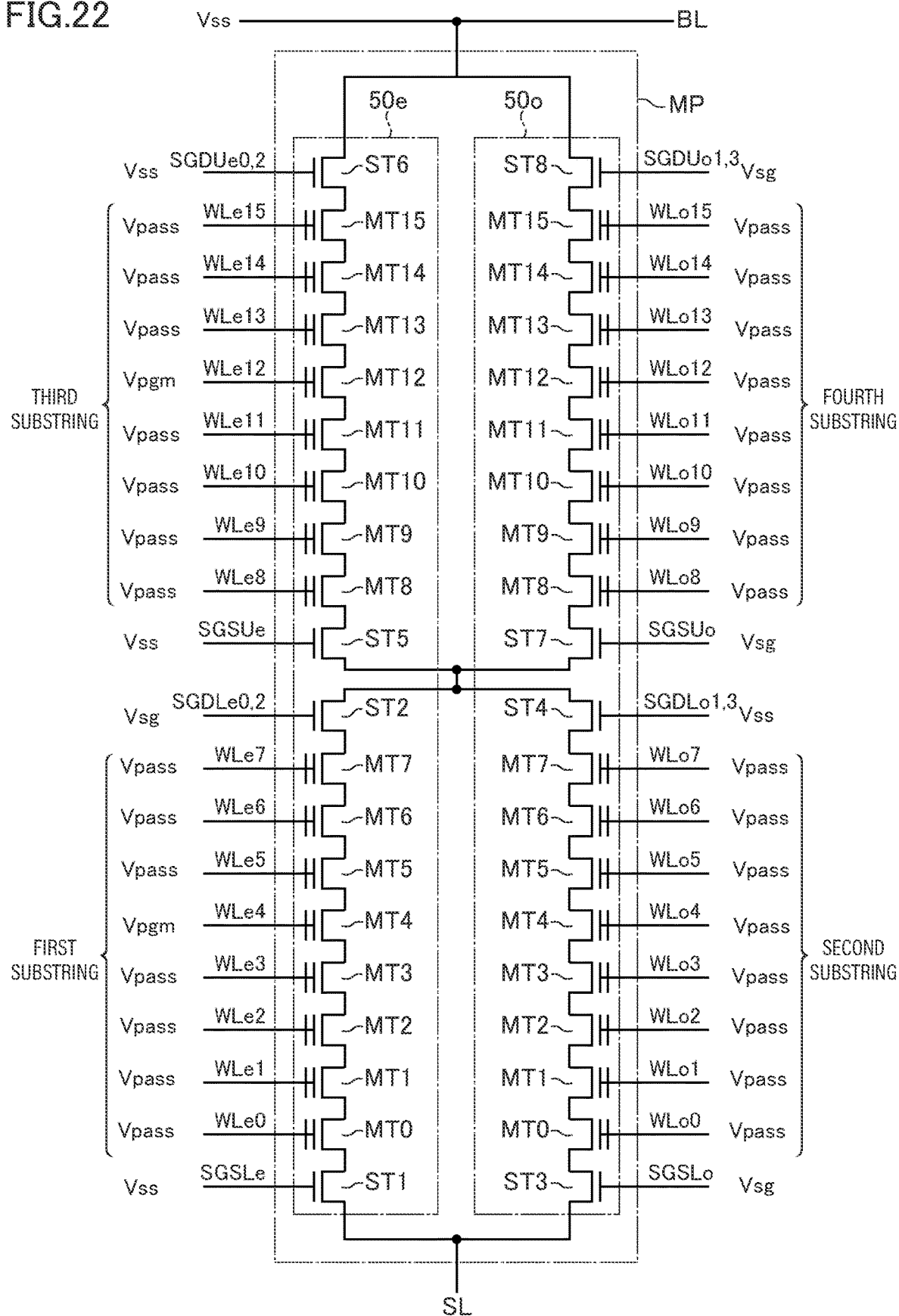
FIG. 22 is a diagram schematically illustrating an equivalent circuit of memory pillar and a voltage applied to each memory cell transistor via a word line in a second example of the semiconductor memory device of the second embodiment.

FIG. 22 is a diagram schematically showing equivalent circuits of the memory pillar (two neighboring NAND string) and voltages applied to each memory cell transistor via word lines in the semiconductor memory device of a second example of the present embodiment.

As a second example of the present embodiment, an example of write operation of the memory cell transistor MT4 whose gates are connected to the word line WLe4 (shared word line WLSe4) in the first substring of NAND string 50o is shown.

By applying Vsg to the select gate lines SGDU1, SGSUo, SGSLo and SGDLe0, the selection transistor ST2, the selection transistor ST3, the selection transistor ST7 and the selection transistor ST8 are turned on. On the other hand, by applying Vss to the other select gate lines, the selection transistor ST1, the selection transistor ST4, the selection transistor ST5 and the selection transistor ST6 are turned off.

Further, Vpgm is applied to the shared word line WLSe4. Further, Vpass is applied to the shared word lines WLSe0-3, WLSe5-7 and WLSo0-7. Further, Vss is applied to the bit line BL. As a result, the write operation is performed on the memory cell transistor MT4 of the first substring. Incidentally, in the third substring, Vpgm is also applied to the gate of memory cell transistor MT12. However, the channel of the memory cell transistors MT of the third substring becomes electrically floating and the voltage of the channel is increased to the boost voltage Vboost. Therefore, the write operation to memory cell transistor MT 12 is not performed. Note that the voltage of the channels of the memory cell transistors MT of the second substring is also increased to the boost voltage Vboost.

Figure 23:
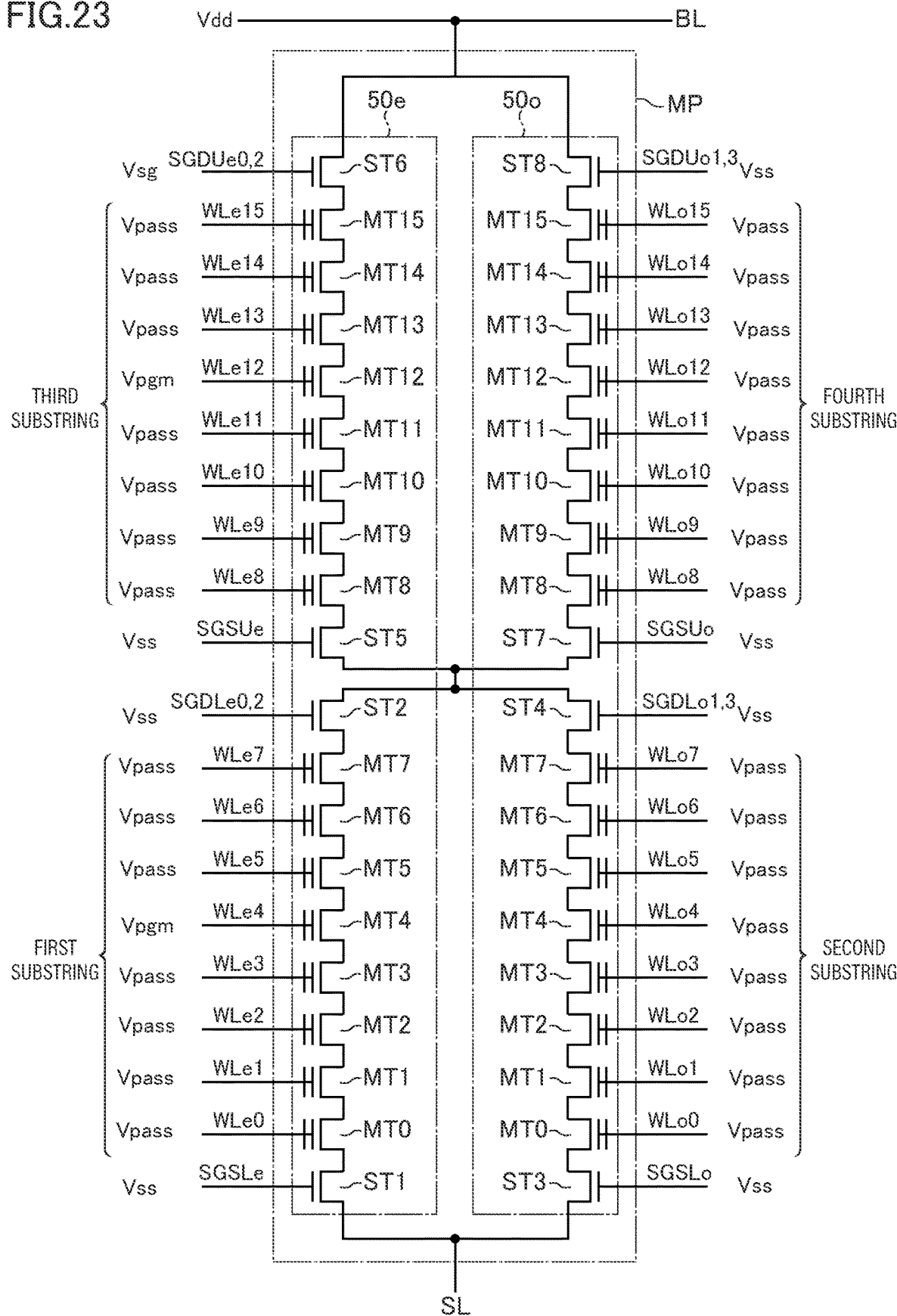
FIG. 23 is a diagram schematically illustrating an equivalent circuit of memory pillar and a voltage applied to each memory cell transistor via a word line in a third example of the semiconductor memory device of the second embodiment.

FIG. 23 is a diagram schematically showing equivalent circuits of the memory pillar (two neighboring NAND string) and voltages applied to each memory cell transistor via word lines in the third example of the semiconductor memory device of the present embodiment.

As a third example of the present embodiment, an example of an operation of suppressing writing to memory cell transistor MT12 in another memory pillar MP having memory cell transistor MT12 whose gate is connected to the word line WLe12 (shared word line WLSe4) will be described. When Vdd is applied to bit line, the operation of the selection transistor ST6 becomes off. Therefore, the channels of the memory cell transistors in the third substring increase to the boost-voltage Vboost. Therefore, writing to the memory cell transistor MT12 is suppressed.

Figure 24:
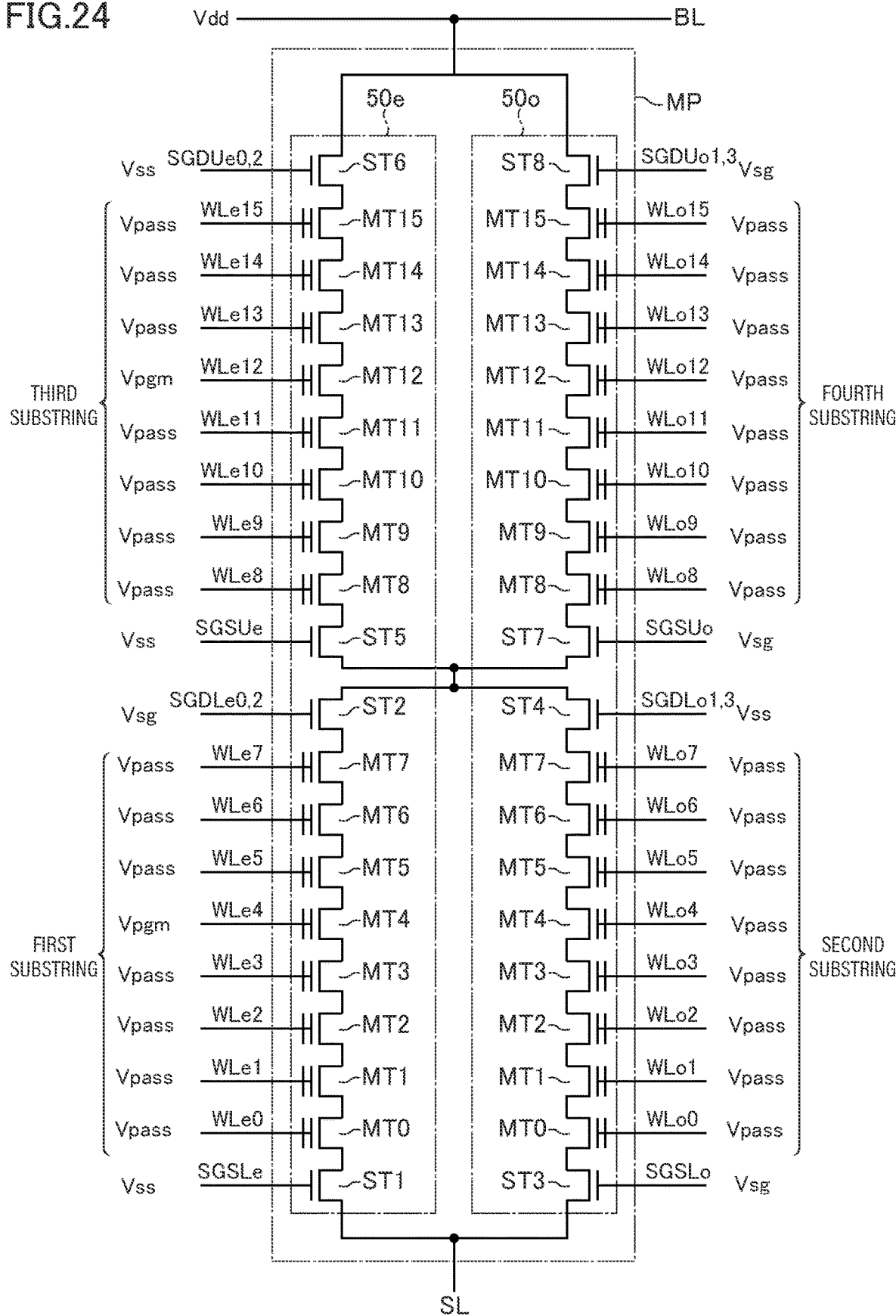
FIG. 24 is a diagram schematically illustrating an equivalent circuit of memory pillar and a voltage applied to each memory cell transistor via a word line in a fourth example of the semiconductor memory device of the second embodiment.

FIG. 24 is a diagram schematically showing equivalent circuits of the memory pillar (two neighboring NAND string) and voltages applied to each memory cell transistor via word lines in the fourth example of the semiconductor memory device of the present embodiment.

As a fourth example of the present embodiment, an example of an operation of suppressing writing to the memory cell transistor MT4 in other memory pillar MP having the memory cell transistor MT4 whose gates are connected to the word line WLe4 (shared word line WLSe4) will be described. When Vdd is applied to the bit line, the operation of the selection transistor ST8 is turned off. Therefore, the voltage of the channel of the memory cell transistor in the fourth substring is increased to the boost voltage Vboost. In addition, the channel of the memory cell transistor in the first substring is conductive with the channel of the memory cell transistor in the fourth substring. Therefore, the voltage of the channel of memory cell transistor in the first substring is also increased to the boost voltage Vboost. Therefore, writing to memory cell transistor MT4 is suppressed.

Semiconductor memory device of the present embodiment also reduces, for example, the number of transistors TR_CG connected to the word line WL by half. Therefore, the density of semiconductor memory device can be increased.

In the semiconductor memory device of the present embodiment, the number of transistors TR_SG connected to the select gate line increases because the number of the select gate line (e.g., the select gate line SGDLe, SGDLo, SGSUe, SGSUo) increases. However, in the example shown in FIG. 17, for example, the number of transistors TR_CG connected to the word line WL is reduced by half. Also, generally, the highest voltage Vpgm applied to the word line WL is higher compared to the highest voltage Vsg applied to select gate line SG. Therefore, the transistor TR_CG connected to the wordline is required to have a higher withstand voltage than the selection transistor ST. Therefore, the transistor TR_CG becomes a larger transistor than the selection transistor ST. In order to increase the density of the semiconductor memory device, it is required to increase the number of memory cell transistor included in one substring. Therefore, when increasing the density of the semiconductor memory device, the effect of downsizing the semiconductor memory device by reducing the number of transistors TR_CG is greater than the effect of increasing in size of the semiconductor memory device by increasing the number of the selection transistor ST.

The semiconductor memory device of the present embodiment can also provide a semiconductor memory device capable of high density.

Figure 25:
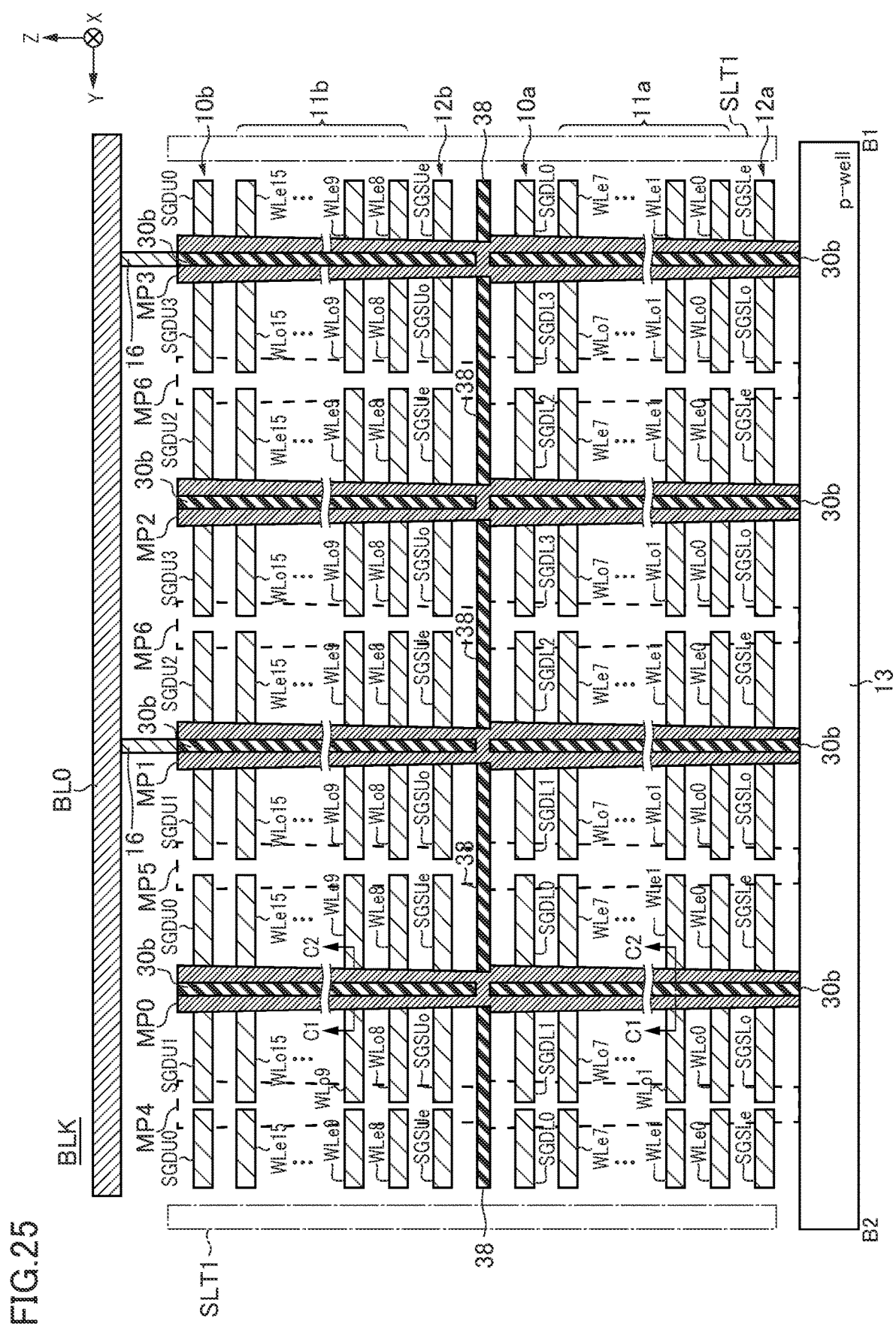
FIG. 25 is a diagram schematically illustrating a voltage applied to selection transistor in memory pillar (two neighboring NAND string) via select gate line and a voltage applied to memory cell transistor in memory pillar via word line in the semiconductor memory device of the third embodiment.

FIG. 25 is a B1-B2 cut end view of the semiconductor memory device shown in FIGS. 3 and 4 in the semiconductor memory device of the present embodiment. FIG. 25 shows the addition of the memory pillar MP4, the memory pillar MP5, the memory pillar MP6 and the memory pillar MP7 to FIG. 5 with dashed lines.

When read operation is performed on the memory cell transistor MT included in the fourth substring having selection transistor ST8 whose gate is connected to the select gate line SGDU1 in the memory pillar MP 5 and the memory pillar MP4, the selection transistor ST7, the selection transistor ST2, and the selection transistor ST1 whose gate is connected to the select gate line SGSUo, SGDL0, and SGSLe are turned on.

However, the gate of the selection transistor ST6 included in memory pillar MP1 is connected to the select gate line SGDU1. In the memory pillar MP1, when read operation is performed on the memory cell transistor MT included in the third substring having the selection transistor ST6, it is preferable that a SGDL2 is further provided for the select gate line SGDL. In other words, for the select gate line SGDL provided above the select gate line SGSLe, it is preferable that at least two types of select gate line SGDL0 and select gate line SGDL2 are provided. Similarly, for the select gate line SGDL provided above the select gate line SGSLo, it is preferable that at least two types of select gate line SGDL1 and select gate line SGDL3 are provided. Similarly, for the select gate line SGLU provided above the select gate line SGSUe, it is preferable that at least two types of select gate line SGDU0 and select gate line SGDU2 are provided. Similarly, for the select gate line SGLU provided above the select gate line SGSUo, it is preferable that at least two types of select gate line SGDU1 and select gate line SGDU3 are provided. As a result, the control as shown in FIGS. 18A-C and 20A-C can be performed.

Semiconductor memory device of the present embodiment can also provide a semiconductor memory device capable of high density.

While certain embodiments have been described, these embodiments have been presented by way of example only, and are not intended to limit the scope of the inventions. Indeed, semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a substrate having a substrate surface extending in a first direction and a second direction crossing the first direction;
a first memory pillar extending in a third direction from the substrate surface, the first memory pillar including
a plurality of first memory cell transistors electrically connected in series with each other, and the first memory cell transistors having a first end and a second end,
a first selection transistor electrically connected to the first end,
a second selection transistor electrically connected to the second end,
a plurality of second memory cell transistors electrically connected in series with each other, the second memory cell transistors having a third end and a fourth end, and the second memory cell transistors being electrically insulated from the first memory cell transistors,
a third selection transistor electrically connecting the first selection transistor and the third end,
a fourth selection transistor electrically connecting the second selection transistor and the fourth end,
a plurality of third memory cell transistors electrically connected in series with each other, and the third memory cell transistors having a fifth end and a sixth end,
a fifth selection transistor electrically connecting the second selection transistor, the fourth selection transistor and the fifth end,
a sixth selection transistor electrically connected to the sixth end,
a plurality of fourth memory cell transistors electrically connected in series with each other, the fourth memory cell transistors having a seventh end and an eighth end, and the fourth memory cell transistors being electrically insulated from the third memory cell transistors,
a seventh selection transistor electrically connecting the second selection transistor, the fourth selection transistor, the fifth selection transistor and the seventh end, and
an eighth selection transistor electrically connecting the sixth selection transistor and the eighth end;
a first select gate line provided above the substrate to extend in parallel to the substrate surface, the first select gate line facing a first side of the first memory pillar, and the first select gate line being electrically connected to a gate of the first selection transistor;
a plurality of first word lines provided above the first select gate line to extend in parallel to the substrate surface, the first word lines facing the first side of the first memory pillar, and the first word lines being electrically connected to gates of the first memory cell transistors, respectively;
a second select gate line provided above the first word lines to extend in parallel to the substrate surface, the second select gate line facing the first side of the first memory pillar, and the second select gate line being electrically connected to a gate of the second selection transistor;
a third select gate line provided above the substrate to extend in parallel to the substrate surface, a position of the third select gate line in the third direction being the same as a position of the first select gate line in the third direction, the third select gate line facing a second side of the first memory pillar, and the third select gate line being electrically connected to a gate of the third selection transistor;
a plurality of the second word lines provided above the third select gate line to extend in parallel to the substrate surface, a position of the second word lines in the third direction being the same as a position of the first word lines in the third direction, respectively, the second word lines facing the second side of the first memory pillar, and the second word lines being electrically connected to gates of the second memory cell transistors, respectively;
a fourth select gate line provided above the second word lines to extend in parallel to the substrate surface, a position of the fourth select gate line in the third direction being the same as a position of the second select gate line in the third direction, the fourth select gate line facing the second side of the first memory pillar, and the fourth select gate line being electrically connected to a gate of the fourth selection transistor;
a fifth select gate line provided above the substrate to extend in parallel to the substrate surface, the fifth select gate line facing the first side of the first memory pillar, and the fifth select gate line being electrically connected to a gate of the fifth selection transistor;
a plurality of third word lines provided above the fifth select gate line to extend in parallel to the substrate surface, the third word lines facing the first side of the first memory pillar, and the third word lines being electrically connected to a gate of the third memory cell transistor and the first word lines, respectively;
a sixth select gate line provided above the third word lines to extend in parallel to the substrate surface, the sixth select gate line facing the first side of the first memory pillar, and the sixth select gate line being electrically connected to the sixth selection transistor;
a seventh select gate line provided above the substrate to extend in parallel to the substrate surface, a position of the seventh select gate line in the third direction being the same as a position of the fifth select gate line, the seventh select gate line facing the second side of the first memory pillar, and the seventh select gate line being electrically connected to a gate of the seventh selection transistor;
a plurality of fourth word lines provided above the seventh select gate line to extend in parallel to the substrate surface, a position of the fourth word lines in the third direction being the same as a position of the third word lines, respectively, the fourth word lines facing the second side of the first memory pillar, and the fourth word lines being electrically connected to the second word lines and the gates of the fourth memory cell transistors, respectively; and an eighth select gate line provided above the fourth word lines to extend in parallel to the substrate surface, a position of the eighth select gate line in the third direction being the same as a position of the sixth select gate line, the eighth select gate line facing the second side of the first memory pillar, and the eighth select gate line being electrically connected to a gate of the eighth selection transistor.

2. The semiconductor memory device according to claim 1, further comprising:
a control circuit,
wherein the control circuit applies a first voltage to the first select gate line, the second select gate line, the seventh select gate line, and the eighth select gate line,
wherein the control circuit applies a second voltage higher than the first voltage to the third select gate line, the fourth select gate line, the fifth select gate line, and the sixth select gate line,
wherein the control circuit applies a third voltage higher than the first voltage and lower than the second voltage to one of the first word lines, and
wherein the control circuit applies a fourth voltage higher than the second voltage to the second word lines and the other first word lines.

3. The semiconductor memory device according to claim 1, further comprising:
a control circuit,
wherein the control circuit applies a first voltage to the third select gate line, the fourth select gate line, the fifth select gate line, and the sixth select gate line,
wherein the control circuit applies a second voltage higher than the first voltage to the first select gate line, the second select gate line, the third select gate line, and the fourth select gate line,
wherein the control circuit applies a third voltage higher than the first voltage and lower than the second voltage to one of the first word lines, and
wherein the control circuit applies a fourth voltage higher than the second voltage to the second word lines and the other first word lines.

4. The semiconductor memory device according to claim 1, further comprising:
a control circuit,
wherein the control circuit applies a first voltage to the first select gate line, the second select gate line, the third select gate line, the fourth select gate line, the fifth select gate line, the seventh select gate line, and the eighth select gate line,
wherein the control circuit applies a second voltage higher than the first voltage to the sixth select gate line,
wherein the control circuit applies a fifth voltage higher than the second voltage to one of the first word lines,
wherein the control circuit applies a sixth voltage lower than the fifth voltage to the second word lines and the other first word lines, and
wherein the control circuit applies a seventh voltage lower than the second voltage to a first bit line.

5. The semiconductor memory device according to claim 1, further comprising:
a control circuit,
wherein the control circuit applies a first voltage to the first select gate line, the fourth select gate line, the fifth select gate line, and the sixth select gate line,
wherein the control circuit applies a second voltage higher than the first voltage to the second select gate line, the third select gate line, the seventh select gate line, and the eighth select gate line,
wherein the control circuit applies a fifth voltage higher than the second voltage to one of the first word lines, and
wherein the control circuit applies a sixth voltage lower than the fifth voltage to the second word lines and the other first word lines, and
wherein the control circuit applies a seventh voltage lower than the second voltage to a first bit line.

6. The semiconductor memory device according to claim 1, further comprising:
a second memory pillar extending in the third direction from the substrate surface, the second memory pillar including
a plurality of fifth memory cell transistors electrically connected in series with each other and having a ninth end and a tenth end,
a ninth selection transistor electrically connected to the ninth end,
a tenth selection transistor electrically connected to the tenth end,
a plurality of sixth memory cell transistors electrically connected in series with each other, the sixth memory cell transistors having an eleventh end and a twelfth end, and the sixth memory cell transistors being electrically insulated from the fifth memory cell transistors,
an eleventh selection transistor electrically connecting the ninth selection transistor and the eleventh end,
a twelfth selection transistor electrically connecting the tenth selection transistor and the twelfth end,
a plurality of seventh memory cell transistors electrically connected in series with each other and the seventh memory cell transistors having a thirteenth end and a fourteenth end,
a thirteenth selection transistor electrically connecting the tenth selection transistor, the twelfth selection transistor, and the thirteenth end,
a fourteenth selection transistor electrically connected to the fourteenth end,
a plurality of eighth memory cell transistors electrically connected in series with each other, the eighth memory cell transistors having a fifteenth end and a sixteenth end, and the eighth memory cell transistors being electrically insulated from the seventh memory cell transistors,
a fifteenth selection transistor electrically connecting the tenth selection transistor, the twelfth selection transistor, the thirteenth selection transistor and the fifteenth end, and
a sixteenth selection transistor electrically connecting the eighth selection transistor and the sixteenth end;
a ninth select gate line provided above the first word lines to extend in parallel to the substrate surface, the ninth select gate line facing a third side of the second memory pillar, and the ninth select gate line being electrically connected to a gate of the tenth selection transistor;
a tenth select gate line provided above the second word lines to extend in parallel to the substrate surface, the tenth select gate line facing a fourth side of the second memory pillar, and the tenth select gate line being electrically connected to a gate of the twelfth selection transistor;
an eleventh select gate line provided above the third word lines to extend in parallel to the substrate surface, the eleventh select gate line facing the third side of the second memory pillar, and the eleventh select gate line being electrically connected to a gate of the fourteenth selection transistor; and a twelfth select gate line provided above the fourth word lines to extend in parallel to the substrate surface, the twelfth select gate line facing the fourth side of the second memory pillar, and the twelfth select gate line being electrically connected to a gate of the sixteenth selection transistor, wherein the first word lines are electrically connected to the gates of the fifth memory cell transistors and the gates of the seventh memory cell transistors, respectively, wherein the second word lines are electrically connected to the gates of the sixth memory cell transistors and the gates of the eighth memory cell transistors, respectively, wherein the first select gate line is further electrically connected to the gate of the ninth selection transistor, wherein the third select gate line is further electrically connected to the gate of the eleventh selection transistor, wherein the fifth select gate line is further electrically connected to the gate of the thirteenth selection transistor, and wherein the seventh select gate line is further electrically connected to the gate of the fifteenth selection transistor.

* * * * *